United States Patent [19]
Hasegawa et al.

[11] Patent Number: 5,661,612
[45] Date of Patent: Aug. 26, 1997

[54] MAGNETIC HEAD DRIVING DEVICE AND MAGNETOOPTICAL RECORDING APPARATUS

[75] Inventors: Koyo Hasegawa, Tokyo; Makoto Hiramatsu, Kawasaki; Kazuyoshi Ishii, Tokyo, all of Japan

[73] Assignee: Canon Kabushiki Kaisha, Tokyo, Japan

[21] Appl. No.: 361,454

[22] Filed: Dec. 21, 1994

Related U.S. Application Data

[63] Continuation of Ser. No. 80,130, Jun. 23, 1993, abandoned.

[30] Foreign Application Priority Data

| Jun. 26, 1992 | [JP] | Japan | 4-191362 |
| Jun. 7, 1993 | [JP] | Japan | 5-160025 |

[51] Int. Cl.⁶ .................. G11B 5/09; G11B 5/03
[52] U.S. Cl. .................. 360/59; 360/66
[58] Field of Search .................. 360/59, 46, 66, 360/67, 61, 72.2, 71.2; 330/252, 257, 113 R, 117 R; 307/270

[56] References Cited

U.S. PATENT DOCUMENTS

| 3,205,352 | 9/1965 | Prucha | 331/117 |
| 3,618,119 | 11/1971 | Rodriquez | 360/46 |
| 3,855,551 | 12/1974 | Ishigaki et al. | 331/113 R |

(List continued on next page.)

FOREIGN PATENT DOCUMENTS

| 0365891 | 5/1990 | European Pat. Off. . |
| 0519729 | 12/1992 | European Pat. Off. . |
| 0540275 | 5/1993 | European Pat. Off. . |

(List continued on next page.)

OTHER PUBLICATIONS

Patent Abstracts of Japan, Kokai No. 3–198204, vol. 15, No. 466, Nov. 1991.
Patent Abstracts of Japan, Kokai No. 61–253609, vol. 11, No. 103, Apr. 1987.
Patent Abstracts of Japan, Kokai No. 59–215008, vol. 9, No. 086, Apr. 1985.

(List continued on next page.)

*Primary Examiner*—Donald T. Hajec
*Assistant Examiner*—Thien Minh Le
*Attorney, Agent, or Firm*—Fitzpatrick, Cella, Harper & Scinto

[57] ABSTRACT

A magnetic head drive device is provided with a magnetic head for generating a magnetic field, a pair of switching elements for switching a current flow direction in the magnetic head, and auxiliary coils respectively connected serially to the switching elements. The current in the magnetic head is controlled by on/off operations of the paired switching elements so as to generate a magnetic field modulated according to an information signal to be recorded. Additional switching elements are serially connected to the auxiliary coils, respectively. In magnetic field modulation recording, the additional switching elements are maintained in the on-state while the modulated magnetic field is generated by the on/off operations of the paired switching elements. In optical modulation recording, the additional switching elements and the paired switching elements are controlled so as to fix the current direction in the magnetic head to generate a magnetic field corresponding to an operation mode such as an erasing mode or a recording mode.

14 Claims, 15 Drawing Sheets

U.S. PATENT DOCUMENTS

| | | | |
|---|---|---|---|
| 3,997,796 | 12/1976 | Sanders et al. | 331/113 R |
| 4,063,193 | 12/1977 | Wilcox | 321/113 R |
| 4,466,027 | 8/1984 | Howell et al. | 360/66 |
| 4,639,794 | 1/1987 | Ferrier | 360/46 |
| 4,918,406 | 4/1990 | Baumbach et al. | 331/117 R |
| 5,034,706 | 7/1991 | Petti et al. | 331/117 R |
| 5,220,467 | 6/1993 | Zucker | 360/66 |

FOREIGN PATENT DOCUMENTS

| | | | |
|---|---|---|---|
| 63-94406 | 4/1988 | Japan . | |
| 63-244402 | 10/1988 | Japan . | |
| 2-79201 | 3/1990 | Japan . | |
| WO9005980 | 5/1990 | WIPO . | |
| WO90-10290 | 9/1990 | WIPO | 360/59 |

OTHER PUBLICATIONS

Patent Abstracts of Japan, Kokai No. 03–228201, vol. 16, No. 005, Jan. 1992.

Jorgensen, "Design and Performance of Magnetic Heads," The Complete Handbook of Magnetic Recording, Third Edition, Jan. 1988, TAB Books, Inc., pp. 217 through 257.

Derwent Publications Limited, Abstract of Japanese patent document 02–316938, Sept. 1990.

Engstrom, "Equivalent Circuit of a Thin Film Recording Head," IEEE Transactions on Magnetics, vol. MAG–20, No. 5, Sep. 1984, pp. 842–844.

Patent Abstracts of Japan, Kokai No. 2–24804, vol. 14, No. 169, Mar. 1990.

Patent Abstracts of Japan, Kokai No. 63–94406, vol. 12, No. 331, Jul. 1988.

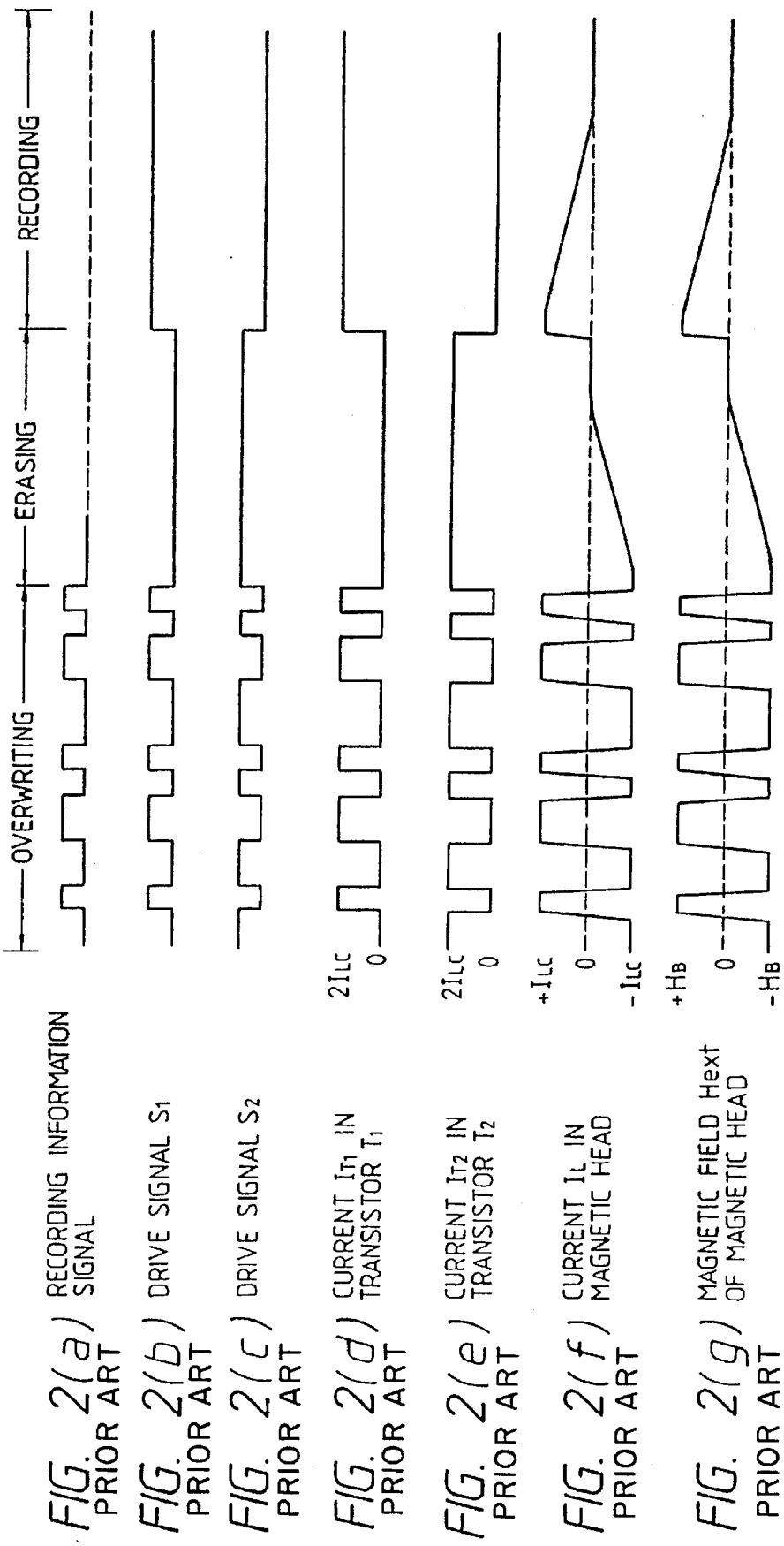

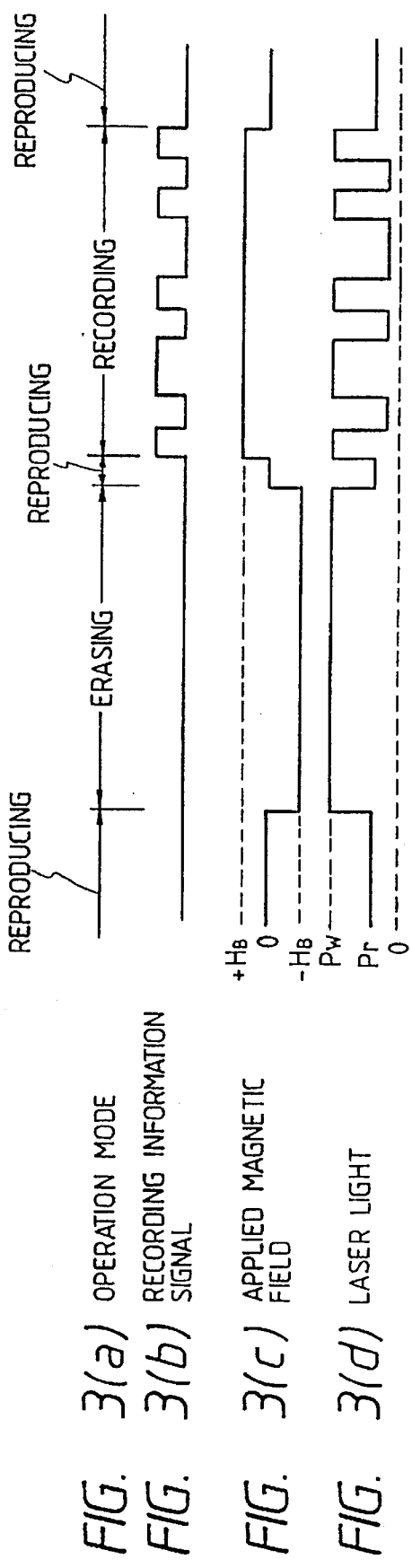

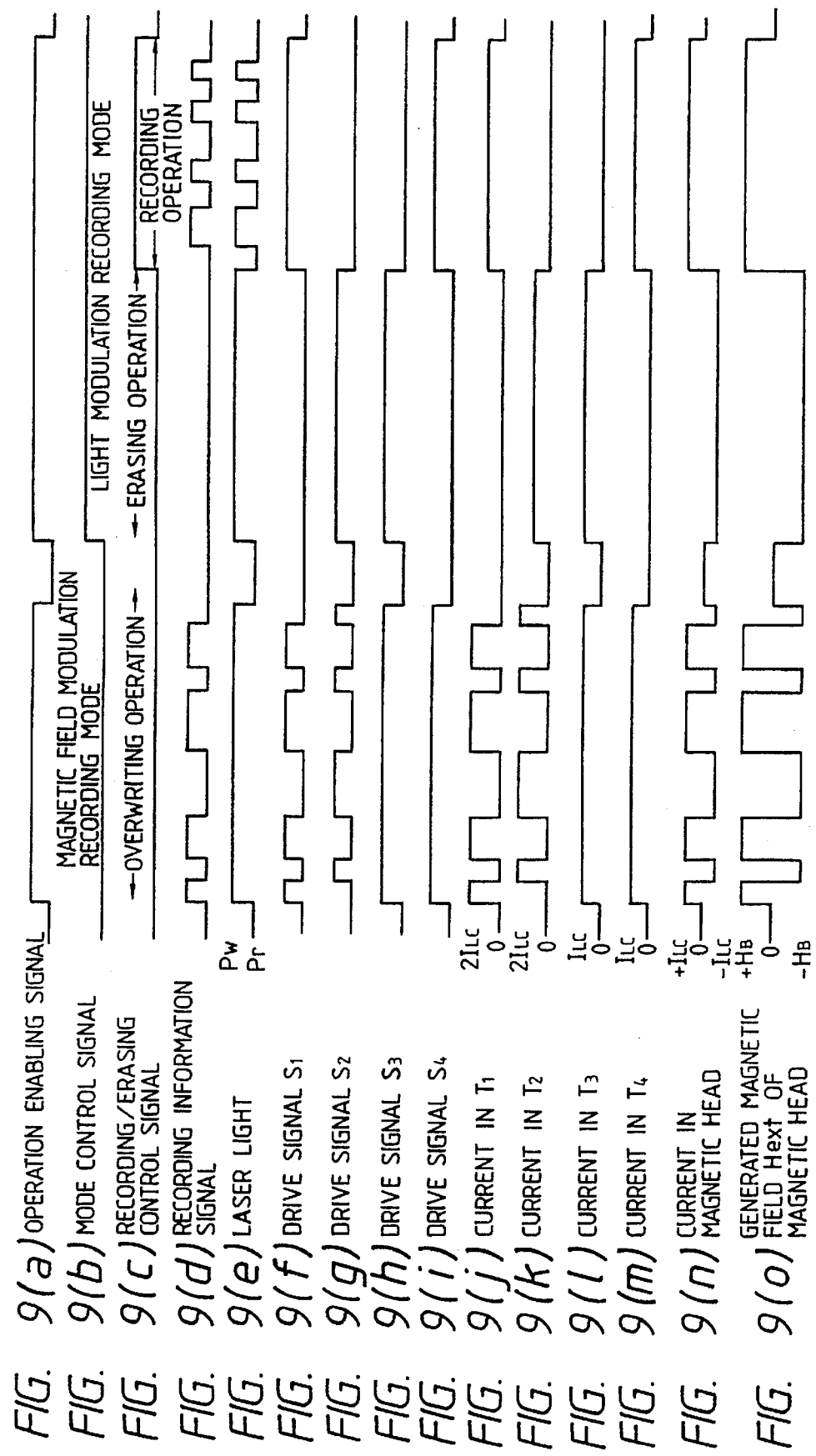

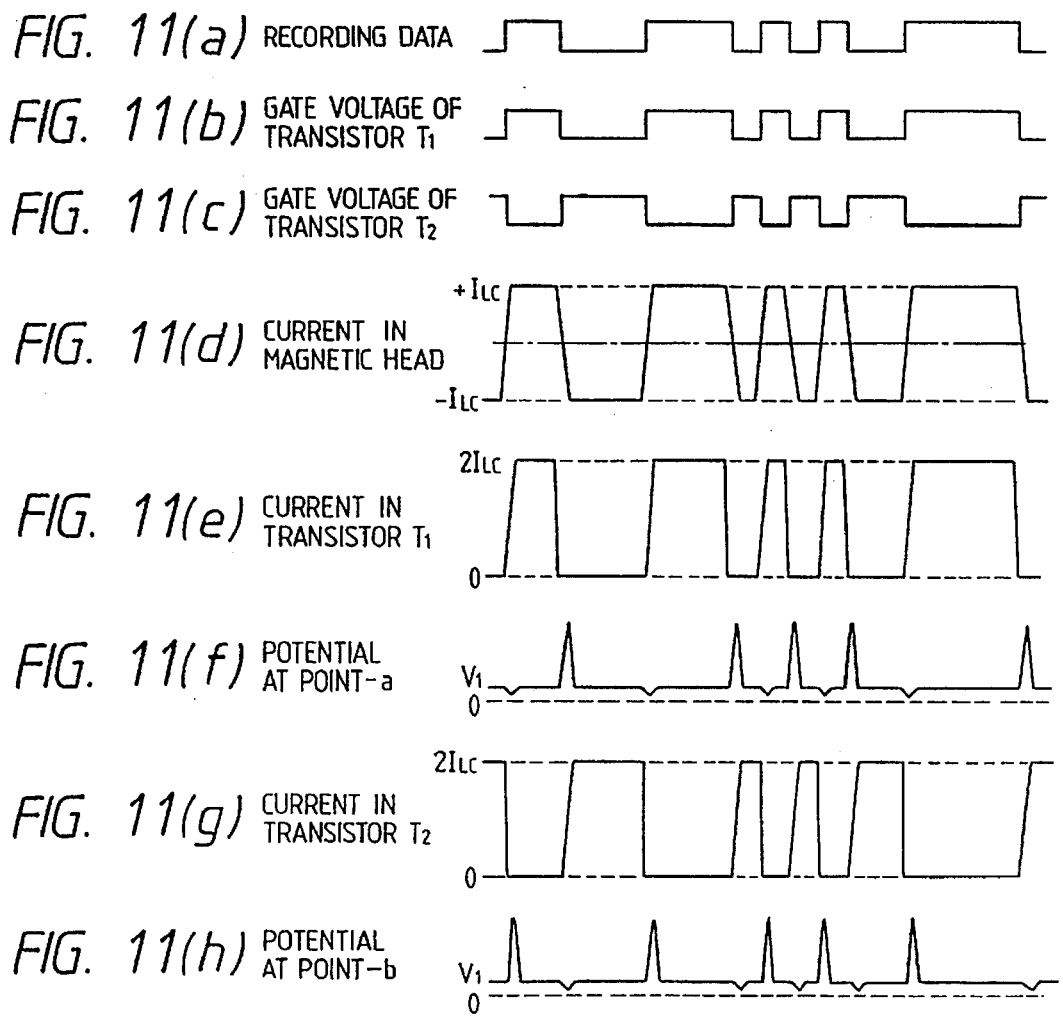

FIG. 13(a) RECORDING DATA 
FIG. 13(b) GATE VOLTAGE OF TRANSISTOR T₁ 
FIG. 13(c) GATE VOLTAGE OF TRANSISTOR T₂ 
FIG. 13(d) CURRENT IN MAGNETIC HEAD 
FIG. 13(e) CURRENT FLOWING THROUGH RESISTOR Rp 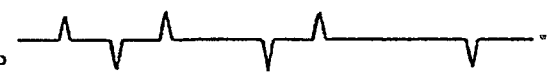

FIG. 18(a) RECORDING DATA 
FIG. 18(b) GATE VOLTAGE OF TRANSISTOR T₁ 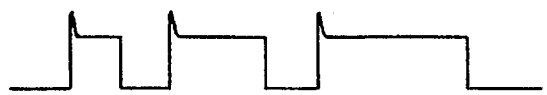
FIG. 18(c) GATE VOLTAGE OF TRANSISTOR T₂ 
FIG. 18(d) CURRENT IN MAGNETIC HEAD 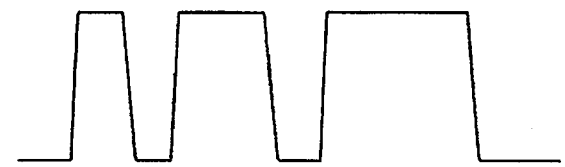
FIG. 18(e) DRAIN VOLTAGE OF TRANSISTOR T₁ 
FIG. 18(f) DRAIN VOLTAGE OF TRANSISTOR T₂ 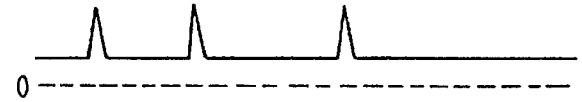

FIG. 21(a) RECORDING DATA 
FIG. 21(b) GATE VOLTAGE OF TRANSISTOR T₁ 
FIG. 21(c) GATE VOLTAGE OF TRANSISTOR T₂ 
FIG. 21(d) CURRENT IN MAGNETIC HEAD 
FIG. 21(e) DRAIN VOLTAGE OF TRANSISTOR T₁ 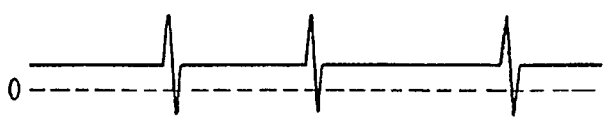
FIG. 21(f) DRAIN VOLTAGE OF TRANSISTOR T₂ 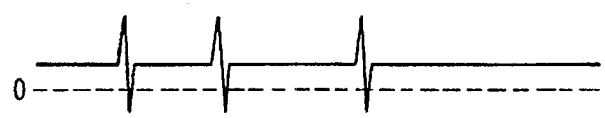

MAGNETIC HEAD DRIVING DEVICE AND MAGNETOOPTICAL RECORDING APPARATUS

This application is a continuation of prior application Ser. No. 08/080,130 filed Jun. 23, 1993, now abandoned.

BACKGROUND OF THE INVENTION

1. Field of the Invention

The present invention relates to a magnetic head driving device for generating a modulated magnetic field, adapted for use in a magnetooptical recording apparatus.

2. Related Background Art

The magnetooptical recording/reproducing apparatus is expected to be a large-capacity auxiliary memory of the next generation, and is being commercialized. There is a strong demand toward a higher transfer rate, and various technologies are being researched and developed for meeting such a requirement. Among such technologies there is known the magnetic field modulation overwriting technology, which is to record information by applying a magnetic field, modulated according to the recording data, to the recording medium, simultaneously with irradiation of a laser beam focused onto the recording medium. In contrast to the magnetooptical recording apparatus of the light modulation process, in which the information recording operation requires two processes of (1) erasure of old data, and (2) writing of new data, the magnetic field modulation overwriting technology can complete the above-mentioned two processes in one process, thereby allowing an increase in the transfer rate at the recording operation.

However, the magnetic head to be employed in the magnetooptical recording apparatus utilizing the magnetic field modulation overwriting technology is different from that of the fixed magnetic field recording apparatus in that it has a large inductance and it cannot generate the required magnetic field unless it is given a large current, because of the following reasons. Firstly, it is required that a perpendicular magnetic field be applied instead of a longitudinal (in-plane) magnetic field, and a closed magnetic circuit cannot be formed because of the presence of an optical head across the recording medium. Secondly, the area of magnetic field application has to be made wider, in order to facilitate the adjustment of positions of the magnetic field application and of the laser beam spot. Thirdly, the distance between the magnetic head and the recording medium has to be increased, for the purpose of protection thereof. A magnetic head driving circuit, for providing a magnetic head of a large inductance with a large current for achieving the above-mentioned requirements is disclosed in the Japanese Patent Laid-Open Application No. 63-94406.

FIG. 1 is a circuit diagram showing the above-mentioned magnetic head driving circuit, in which shown are a magnetic head 1 and auxiliary coils L1, L2. The magnetic head 1 is composed, in practice, of an unrepresented core and a coil L wound thereon. Switching elements T1, T2 are required to switch currents of 100 mA or larger within an extremely short time, and are generally composed of field effect transistors for meeting such a requirement. In the following description, the field effect transistors T1, T2 are simply called transistors. Driving circuits 2, 3 are provided for driving gates of the transistors T1, T2. The auxiliary coils L1, L2 are constantly given currents regardless of the turn-on or turn-off state of the transistors T1, T2, and serve to invert the current supplied to the magnetic head 1 at a high speed.

FIGS. 2(a) through 2(g) are timing charts showing signal wave forms in various parts of the magnetic head driving circuit mentioned above, wherein FIG. 2(a) indicates an information signal to be recorded; FIG. 2(b) indicates a drive signal S1 supplied to the drive circuit 2; and FIG. 2(c) indicates a drive signal S2 supplied to the drive circuit 3. The drive signal S1 is the same in phase as the information signal, while the drive signal S2 is inverted in phase from the information signal. In the case of information recording, or, of information overwriting on the previously recorded information, the above-mentioned drive signals S1, S2 are respectively supplied to the drive circuits 2, 3 which generate driving voltages, the same in phase as the drive signals, for supply to the gates of the transistors T1, T2, whereby said transistors T1, T2 are alternately turned on to supply the magnetic head 1 with an AC current $\pm I_{LC}$ as shown in FIG. 2(f). In this state, the currents $I_{T1}$, $I_{T2}$ of the transistors T1, T2 are respectively double that of the magnetic head current $I_{LC}$, as shown in FIGS. 2(d) and 2(e). Thus the magnetic head 1 generates a magnetic field $\pm H_B$ modulated according to the information signal, as indicated in FIG. 2(g). In information recording, the modulated magnetic field is applied by the magnetic head to the magnetooptical recording medium while it is irradiated with a light beam having a constant intensity by the optical head, whereby magnetizations corresponding to the information signal are recorded as information pits on the recording medium.

In contrast to the information recording by magnetic field modulation explained above, the magnetooptical recording medium of the preceding first generation employed the information recording by the optical modulation process, which effects the recording of new information after the previously recorded information is erased, and in which the function of the magnetic head is different from that in the magnetic field modulation process. The principle of the optical modulation process is illustrated in FIGS. 3(a) through 3(d), in which FIG. 3(a) shows the operation mode; and FIG. 3(b) indicates an information signal to be recorded. In the case of information recording, an area to be recorded is at first subjected to the application of a magnetic field $-H_B$ with the irradiation of a laser beam of an erasing power, as indicated in FIGS. 3(c) and 3(d), whereby the old information recorded on the magnetooptical recording medium is erased. After the erasure, the magnetic head applies a magnetic field $+H_B$, as shown in FIG. 3(c), which has a polarity inverse to that of the magnetic field at the erasure, while the optical head effects irradiation of a laser beam modulated in intensity by the information of a laser beam modulated in intensity by the information signal as shown in FIG. 3(d), whereby the information is recorded on the recording medium.

There will be explained, with reference to FIGS. 2(a) through 2(g), the operations in the case of information recording by optical modulation, employing the magnetic head driving circuit shown in FIG. 1. When the magnetic head is DC driven instead of high frequency drive in the circuit shown in FIG. 1, the transistor T1 is turned off while the transistor T2 is continuously turned on during the erasing period of the optical modulation process. In this case, the auxiliary coils L1, L2 do not work as inductance elements but work as resistance elements corresponding to the DC resistances of the coils. The DC resistances of the auxiliary coils L1, L2 are for example about 0.1Ω, while that of the magnetic head 1 is in the order of 1Ω. During the erasing period, the transistor T2 receives a current supplied from the auxiliary coil L1 through the magnetic head 1 and a current supplied from the auxiliary coil L2. Consequently, in the erasing mode, the current in the magnetic head 1 gradually decreases, from $-I_{LC}$, according to a time constant determined by the inductance and the resistance in the driving circuit, as shown in FIG. 2(f). The current is mostly supplied from the auxiliary coil L2 because of its small resistance, and the current in the magnetic head 1 is determined by energy accumulated in the auxiliary coil L1, the energy being reduced with the above-mentioned time constant. The time constant $\tau$, with which the current decreases from $-I_{LC}$, is given by $L_t/R_T$ wherein $L_t$ is the sum of the inductances of the auxiliary coil L1 and the magnetic head, while $R_T$ is the sum of the resistances of the auxiliary coil L1 and the magnetic head and the on-resistance of the transistor T2. $R_T$ is mostly determined by the on-resistance of the transistor T2, which is sufficiently larger than the resistances of the auxiliary coil and the magnetic head.

For example, the on-resistance is about 25Ω, for a power source voltage of 5 V and $I_{LC}$ of 200 mA. When inductances of the auxiliary coil L1 and the magnetic head are 100 µH and 1.5 µH, respectively, the time constant $\tau$ becomes about 4.06 µS. Thus, during the erasing period, the magnetic head current gradually decreases with the above-mentioned time constant, as shown in FIG. 2(f), eventually to a value determined by the ratio of the resistance of the auxiliary coil L1 and that of the magnetic head and the auxiliary coil L2. For example, an initial magnetic head current $I_{LC}$ of 200 mA decreases to 18.2 mA. Therefore, the magnetic field generated by the magnetic head, being proportional to the current, gradually decreases from $-H_B$ according to the time constant $\tau$ as shown in FIG. 2(g), and the old information cannot be erased because of the varying magnetic field. Also, in the recording operation, the magnetic head current decreases as indicated in FIGS. 2(f) and 2(g), and the generated magnetic field becomes deficient for the information recording. The magnetic head driving circuit of the magnetic field modulation process is thus incapable of information erasure or recording in the optical modulation process, so that the magnetooptical recording apparatus has to be provided with exclusive driving circuits for achieving the recording by the magnetic field modulation process and by the optical modulation process.

Also, in the magnetic head driving circuit shown in FIG. 1, the potential at a point a or b when the transistor T1 or T2 is turned on is given by the power source voltage minus the voltage drop in the auxiliary coil. More specifically, for an amplitude $\pm I_{LC}$ of the AC current in the magnetic head, the potential $V_0$ at the point a or b is given by $V-R_L \cdot I_{LC}$ wherein V is the power source voltage and $R_L$ is the DC resistance of the auxiliary coil. In FIG. 4 there are shown the currents in the transistors T1, T2 and the potential $V_0$ at the points a, b. Also, when the transistor T1 or T2 is turned on, there will flow a current $2I_{LC}$, so that the transistor T1 or T2 consumes an average power of $V_0 \times 2I_{LC}/2$ even when the recording data do not contain the DC component. The DC resistance of the auxiliary coils is generally small and can be assumed to be on the order of 0.5Ω. Also, assuming that the DC power source voltage is 5 V and the modulating current amplitude of the magnetic head is 300 mA, $V_0$ becomes 4.85 V and the average power consumption becomes about 1.455 W when the recording data are free from the DC component.

When a high-speed power MOS FET is employed as the switching element there will result a breakage of the device by the power consumption mentioned above, because the maximum nominal power rating of such a device is about 1 W. Also, current drive of the magnetic head is conducted by providing the power source with a constant current source as shown in FIG. 1, and, in such a case, the transistor is not necessarily overloaded because the aforementioned power is consumed by the transistor and by the constant current source. However, since such a constant current source is generally composed of bipolar transistors or the like, there may still be encountered the destruction of the components of such a constant current source if the power consumption thereof is large. It is also conceivable to employ a switching element of a large nominal power rating, but a high transfer rate cannot be realized because such a switching element of a high power rating is inevitably associated with a slower switching speed. On the other hand, when a high-speed switching element is employed, it is necessary to conduct heat dissipation appropriately in order to prevent destruction of the element.

Also, in the magnetooptical recording apparatus employing the magnetic field modulation overwriting technology, a large current has to be supplied to the magnetic head having a large inductance, and, in order to achieve a high transfer rate, it is necessary to reduce the time period for inversion of the magnetic field, thereby increasing the frequency of repetition. For recording data of a repeating frequency of several MHz, the time period for magnetic field inversion generally has to be shorter than 20 ns. However, because the magnetic head has a large inductance, the time period of magnetic field inversion cannot be made short if the circuit connected to both ends of the magnetic head has a large floating capacitance. The time period for magnetic field inversion cannot be made shorter than a minimum value determined by the inductance of the magnetic head and the floating capacitance of the circuit connected to both ends of the magnetic head, regardless of the structure of the circuit. In the magnetic head driving circuit shown in FIG. 1, the time period for magnetic field inversion is about 100 ns if the magnetic head has an inductance of 1 µH and the floating capacitance is about 1 nF.

Also, a short magnetic field inversion time period results in an increased loss in the magnetic head. The loss in the magnetic head at a high frequency can be considered, in an equivalent circuit consisting of a parallel connection of an inductance $L_p$ and a resistance $R_p$, as the loss by a current in the resistance $R_p$, and, when the magnetic field inversion time period is shortened, the maximum frequency in the recording frequency range becomes higher, whereby the current in the resistance $R_p$ increases to enhance the loss in the magnetic head. For this reason the magnetic head shows considerable temperature increase, and the core of the magnetic head may eventually exceed the Curie point, whereby the magnetic permeability of the magnetic material may become smaller and the generated magnetic field may become insufficient for information recording.

FIG. 5 shows the above-mentioned current in the resistance $R_p$. For example, a magnetic head with an inductance of about 1 µH and with $R_p$ of about 200Ω is used in modulated drive with a magnetic field inversion time period of about 10 ns and a repeating frequency of ca. 6 MHz, the loss in the resistance $R_p$ becomes about 0.5 W. However, the loss in the magnetic head has to be about 0.2 W or less, in consideration of the temperature increase of the magnetic head itself. In this manner the magnetic field inversion time period cannot be made shorter if a large floating capacitance is connected to the ends of the magnetic head, while a shorter magnetic field inversion time period increases the loss in the magnetic head, thereby disabling the information recording.

Also, in the conventional example explained above, the voltage supplied to the gates of the transistors cannot be made higher than the power source voltage employed in the apparatus. A recent trend is to reduce the power source voltage in the apparatus in order to decrease the power consumption, but such reduced power source voltage also reduces the voltage supplied to the gate of the transistor, thereby decreasing the amplitude of the modulated current. FIG. 6 is a timing chart of the conventional magnetic head driving circuit, in which the high-state voltages released from the driving circuits 2, 3 are determined by the power source employed in the apparatus. Thus, a reduced power source voltage lowers the output voltages of the driving circuits 2, 3, thereby decreasing the voltage supplied to the gates of the switching transistors, whereby the currents therein are also decreased to reduce the amplitude of the modulated current in the magnetic head, thereby resulting in a deficiency in the generated magnetic field.

Furthermore, in the above-explained conventional magnetic head driving circuit, the off-time of the switching elements has to be shortened in order to decrease the magnetic field inversion time period, but this is in fact difficult to achieve because the FET employed as the switching element has a long off-time. Furthermore, if the on/off timings of the switching elements by the driving circuits 2, 3 are somewhat shifted, an inverse voltage is generated across the magnetic head, thereby generating an inverse current in the switching elements and distorting the waveform of the modulated current.

SUMMARY OF THE INVENTION

In consideration of the foregoing, an object of the present invention is to provide a magnetic head driving device usable both for the magnetic field modulation process and for the optical modulation process.

Another object of the present invention is to provide a magnetic head driving device capable of alleviating the power load of the switching elements, thereby avoiding a possibility of destruction thereof.

Still another object of the present invention is to provide a magnetic head driving device capable of reducing the magnetic field inversion time period, without increasing the loss in the magnetic head.

Still another object of the present invention is to provide a magnetic head driving device capable of properly driving the magnetic head even with a reduced power source voltage of the apparatus.

Still another object of the present invention is to provide a magnetic head driving device capable of preventing the inverse current in the switching elements, resulting from a reduced magnetic field inversion time period or from an inverse voltage generation in the auxiliary coils.

The objects of the present invention can be attained by a magnetic head driving device provided with a magnetic head for magnetic field generation, at least a pair of switching elements for switching the direction of current in the magnetic head, and auxiliary coils respectively connected serially to the switching elements, in which the current in the magnetic head is controlled by the on/off operations of the switching elements thereby generating a magnetic field modulated according to an information signal to be recorded, wherein the switching elements are respectively connected serially to the auxiliary coils, and, when the magnetic field modulation recording is selected, the switching elements are maintained in the on-state and the modulated magnetic field is generated by the on/off operations of the above-mentioned paired switching elements, while, when the optical modulation recording is selected, the switching elements and the first-mentioned paired switching elements are so controlled as to obtain a constant current direction in the magnetic head corresponding to the erasing mode and the recording mode, thereby generating an erasing magnetic field and a recording magnetic field corresponding to the respective operation mode.

The objects of the present invention can be attained by a magnetic head driving device provided with a magnetic head for magnetic field generation, and at least a pair of switching elements for switching the direction of current in the magnetic head, in which the current in the magnetic head is controlled by the on/off operations of the switching elements thereby generating a magnetic field modulated according to the information signal, wherein resistance elements for reducing the power loads of the switching elements are respectively connected serially to the switching elements.

The objects of the present invention can be attained by a magnetic head driving device provided with a magnetic head for magnetic field generation and adapted to control the direction of current in the magnetic head according to the information signal to be recorded thereby generating a magnetic field modulated according to the information signal, wherein, when the magnetic head is considered as an equivalent circuit consisting of a parallel connection of an inductance and a resistance, the inductance $L_p$ is selected to be about 0.2 to 2.0 μH and the resistance $R_p$ is selected to be about 200Ω or higher in the vicinity of the maximum frequency in the information recording frequency range.

Furthermore, the objects of the present invention can be attained by a magnetic head driving device provided with a magnetic head for magnetic field generation, a pair of switching elements for switching the direction of current in the magnetic head, and auxiliary coils respectively connected serially to the switching elements, in which the current in the magnetic head is controlled by the on/off operations of the switching elements, thereby generating a magnetic field modulated according to the information signal to be recorded, wherein the control terminal of each of the switching elements is connected through a capacitance element to an auxiliary coil connected to the other switching element, whereby an inverse voltage generated in each auxiliary coil when each switching element is turned off is applied, through said capacitance element, to the control terminal of the other switching element to be turned on.

Furthermore, the objects of the present invention can be attained by a magnetic head driving device provided with a magnetic head for magnetic field generation, and a pair of switching elements for switching the direction of current in the magnetic head, in which the current in the magnetic head is controlled by the on/off operations of the switching elements thereby generating a magnetic field modulated according to the information signal to be recorded, wherein the terminals at the ground side of the switching elements are mutually connected, and a diode is connected between the mutually connected point and the ground, in order to inversely bias the control terminal when the switching element is turned off.

Furthermore, the objects of the present invention can be attained by a magnetic head driving device provided with a magnetic head for magnetic field generation, a pair of switching elements for switching the direction of current in the magnetic head, and auxiliary coils respectively connected serially to the switching elements, in which the current in the magnetic head is controlled by on/off operations of the switching elements, thereby generating a magnetic field modulated according to the information signal to be recorded, wherein, between the ground side terminal of each of the switching elements and the ground, there is connected a diode for inversely biasing the control terminal when each switching element is turned off and for blocking an inverse current in the switching element, caused by an inverse voltage generation in the auxiliary coil.

Furthermore, the objects of the present invention can be attained by a magnetic head driving device provided with a pair of switching elements, a pair of auxiliary coils respectively connected serially to the switching elements, and a magnetic head for magnetic field generation connected between junctions points between the paired switching elements and the paired auxiliary coil, in which the switching elements are alternately turned on and off according to the information to be recorded thereby switching the direction of current supplied to the magnetic head according to the information signal, wherein the inductance of the paired auxiliary coils is selected within a range from 10 to 1000 times of that of the magnetic head, and the self resonance frequency of the auxiliary coils is selected higher than the maximum frequency of the information signal to be recorded.

Furthermore, the objects of the present invention can be attained by a magnetic head driving device provided With a magnetic head for magnetic field generation, a pair of switching elements for switching the direction of current in the magnetic head, and auxiliary coils respectively connected serially to the switching elements, in which the current in the magnetic head is controlled by the on/off operations of the switching elements, thereby generating a magnetic field modulated according to the information signal to be recorded, wherein diodes are respectively connected serially to the switching elements.

BRIEF DESCRIPTION OF THE DRAWINGS

FIGS. 2(a) through 2(g) are timing charts showing signal wave forms in various parts of the driving circuit shown in FIG. 1, when it is used in the magnetic field modulation overwriting process and in the erasure and recording by the optical modulation process;

FIGS. 3(a) through 3(d) are timing charts showing the magnetic field and the laser beam applied in the erasure and recording of information in the optical modulation process;

FIGS. 9(a) through 9(o) are timing charts showing signal wave forms in various parts of the embodiment shown in FIG. 7;

FIGS. 11(a) through 11(h) are timing charts showing signal wave forms in various parts of the embodiment shown in FIG. 10;

FIGS. 13(a) through 13(e) are timing charts showing signal wave forms in various parts of the embodiment shown in FIG. 12;

FIGS. 18(a) through 18(f) are timing charts showing signal wave forms in various parts of the embodiment shown in FIG. 17;

FIG. 19 is a circuit diagram of a fifth embodiment of the present invention;

FIG. 20 is a circuit diagram of a sixth embodiment of the present invention; and FIGS. 21(a) through 21(f) are timing charts showing signal wave forms in various parts of the embodiment shown in FIG. 20.

DETAILED DESCRIPTION OF THE PREFERRED EMBODIMENTS

Figure 1:
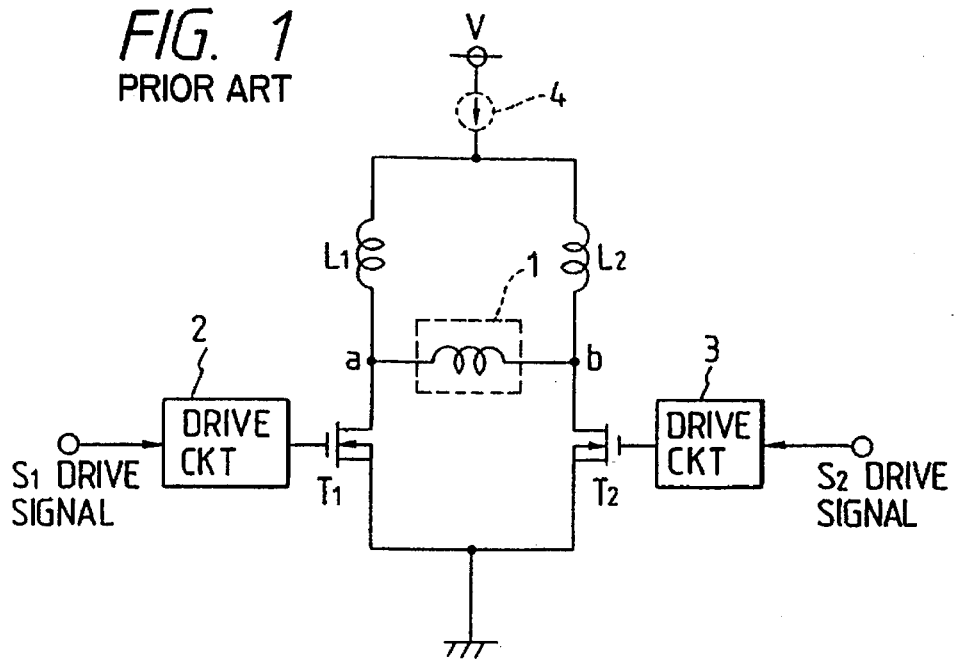
FIG. 1 is a circuit diagram of a conventional magnetic head driving circuit.
Figure 7:
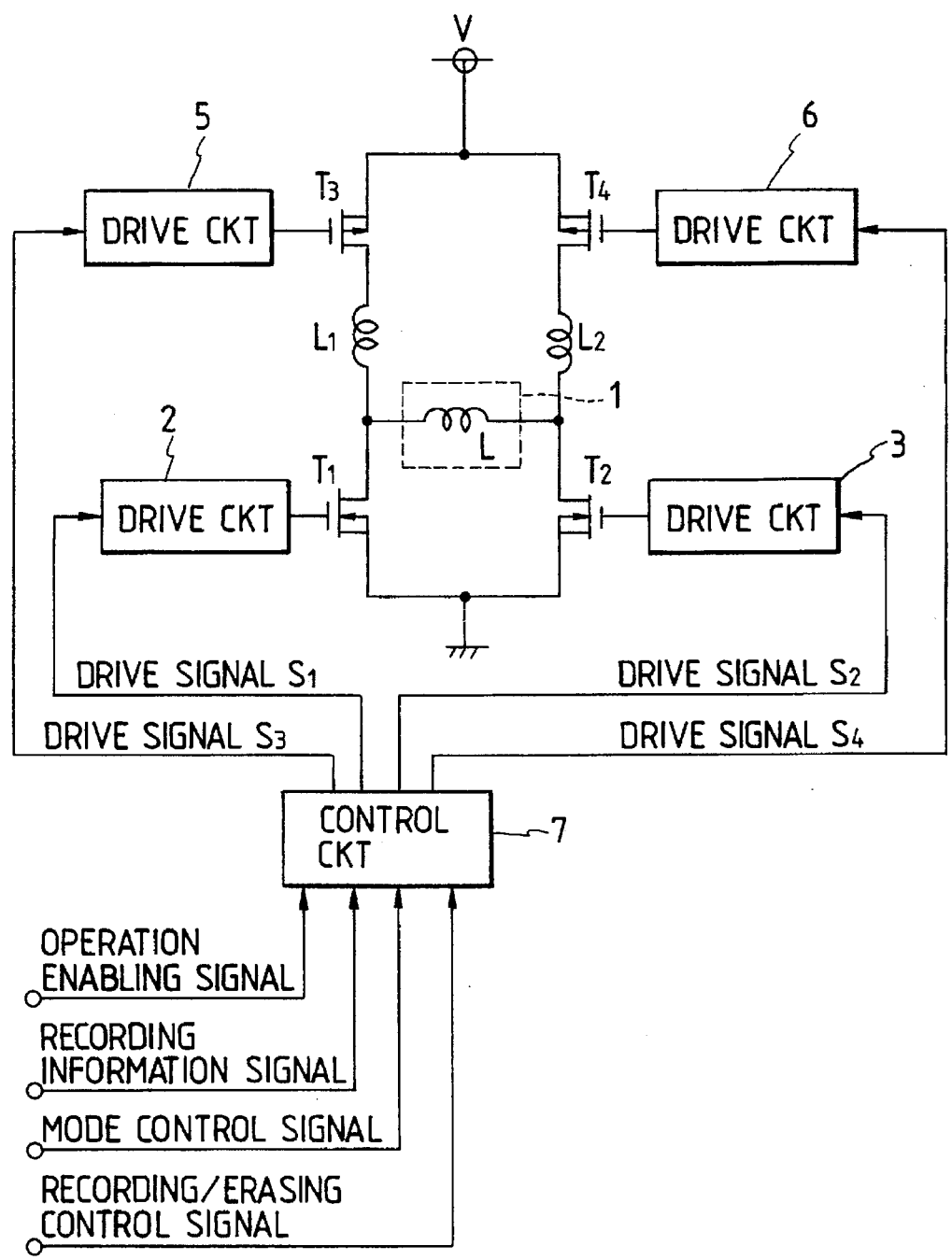
FIG. 7 is a circuit diagram, showing a first embodiment of the magnetic head driving device of the present invention.

The present invention will be clarified in detail by preferred embodiments thereof shown in the attached drawings. FIG. 7 is a circuit diagram showing a first embodiment of the magnetic head driving device of the present invention, wherein the same components as those in FIG. 1 are represented by same symbols. In FIG. 7 there are shown a magnetic head 1 composed of a coil L wound on an unrepresented magnetic core; field effect transistors T1, T2 (hereinafter represented merely as transistors) provided as the switching elements; and driving circuits 2, 3 for driving said transistors T1, T2. These components are the same as those shown in FIG. 1. There are further provided field effect transistors T3, T4 (hereinafter represented merely as transistors) respectively connected serially to auxiliary coils L1, L2; driving circuits 5, 6 for driving the transistors T3, T4; and a control circuit 7 for controlling the function of the magnetic head driving device based on various input signals, thereby generating the required magnetic field in the magnetic field modulation recording or in the optical modulation recording.

Figure 8:
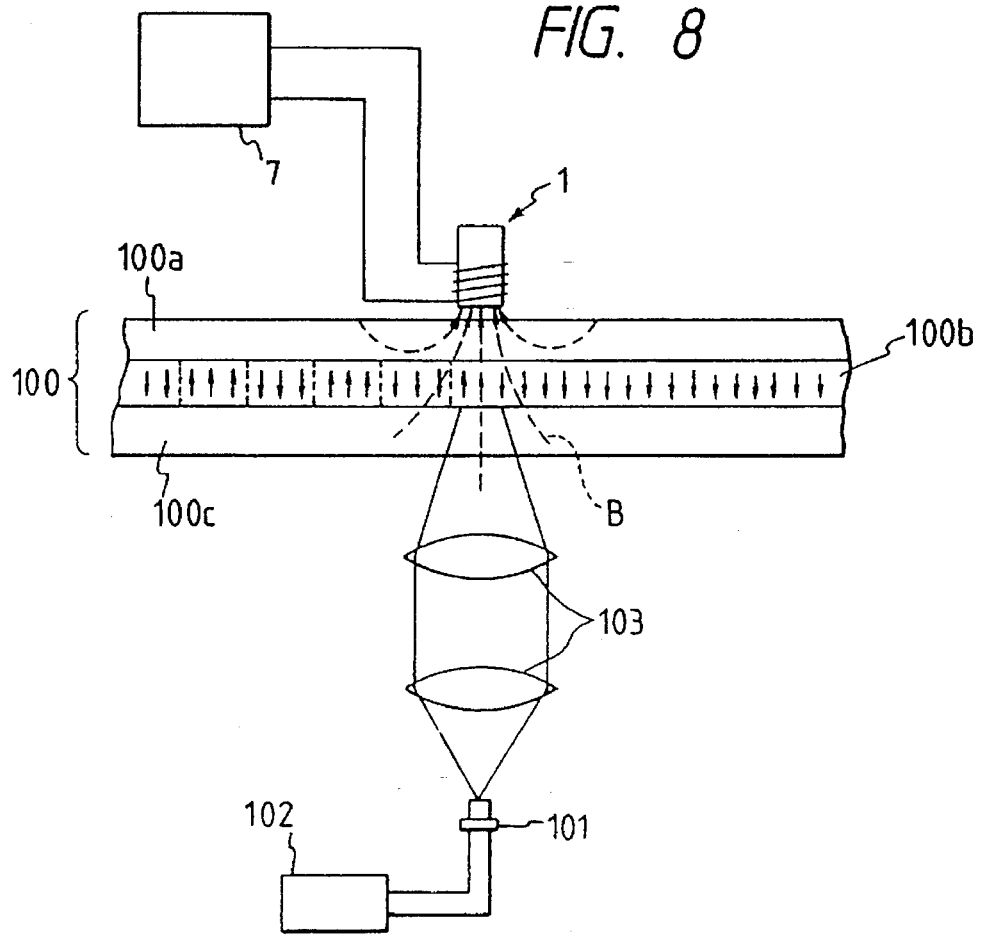
FIG. 8 is a schematic view of a magnetooptical recording apparatus employing the magnetic head driving device of the present invention.
Figure 4:
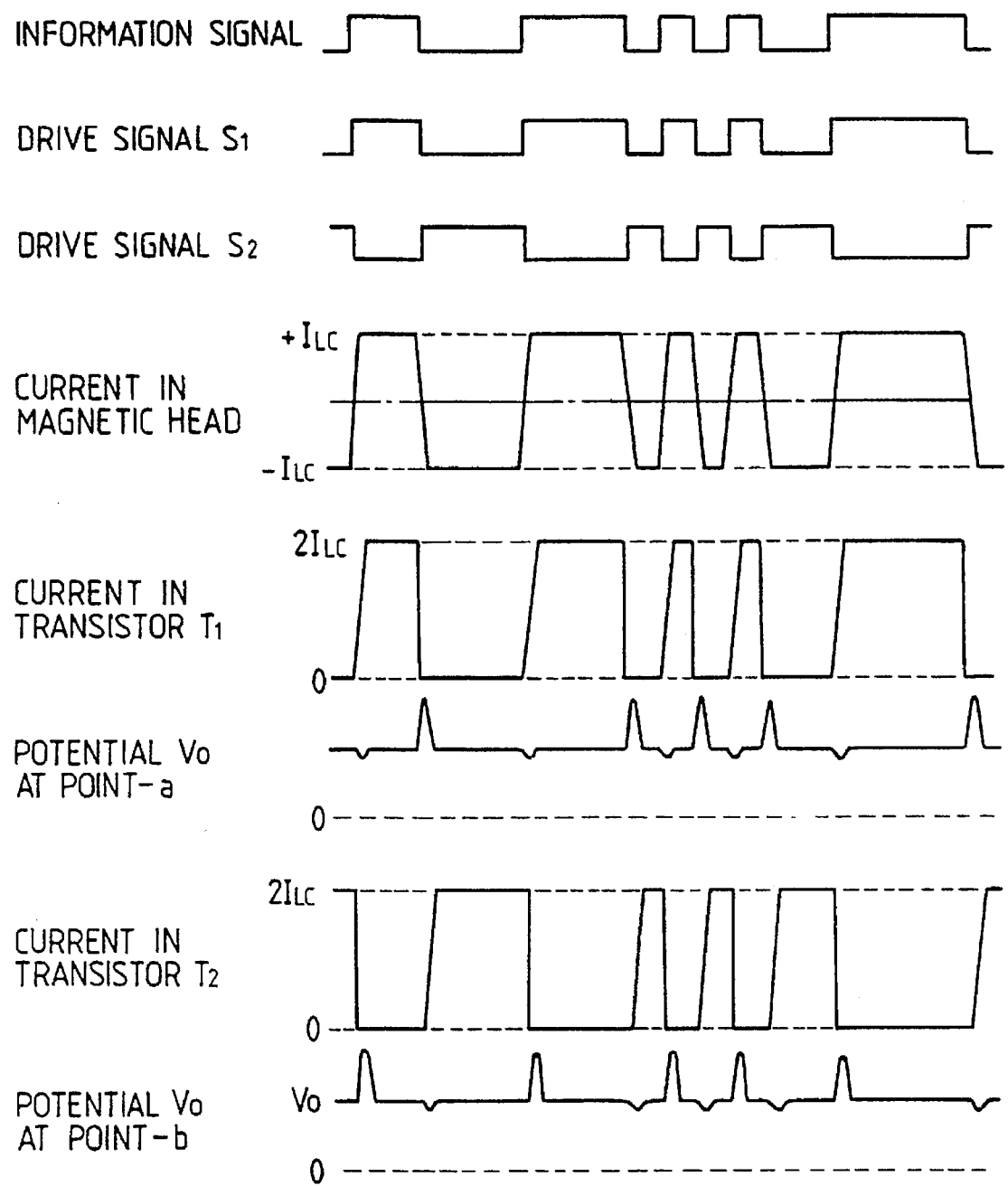
FIG. 4 is a wave form chart showing potentials at the points a and b in the conventional driving circuit shown in FIG. 1.
Figure 5:
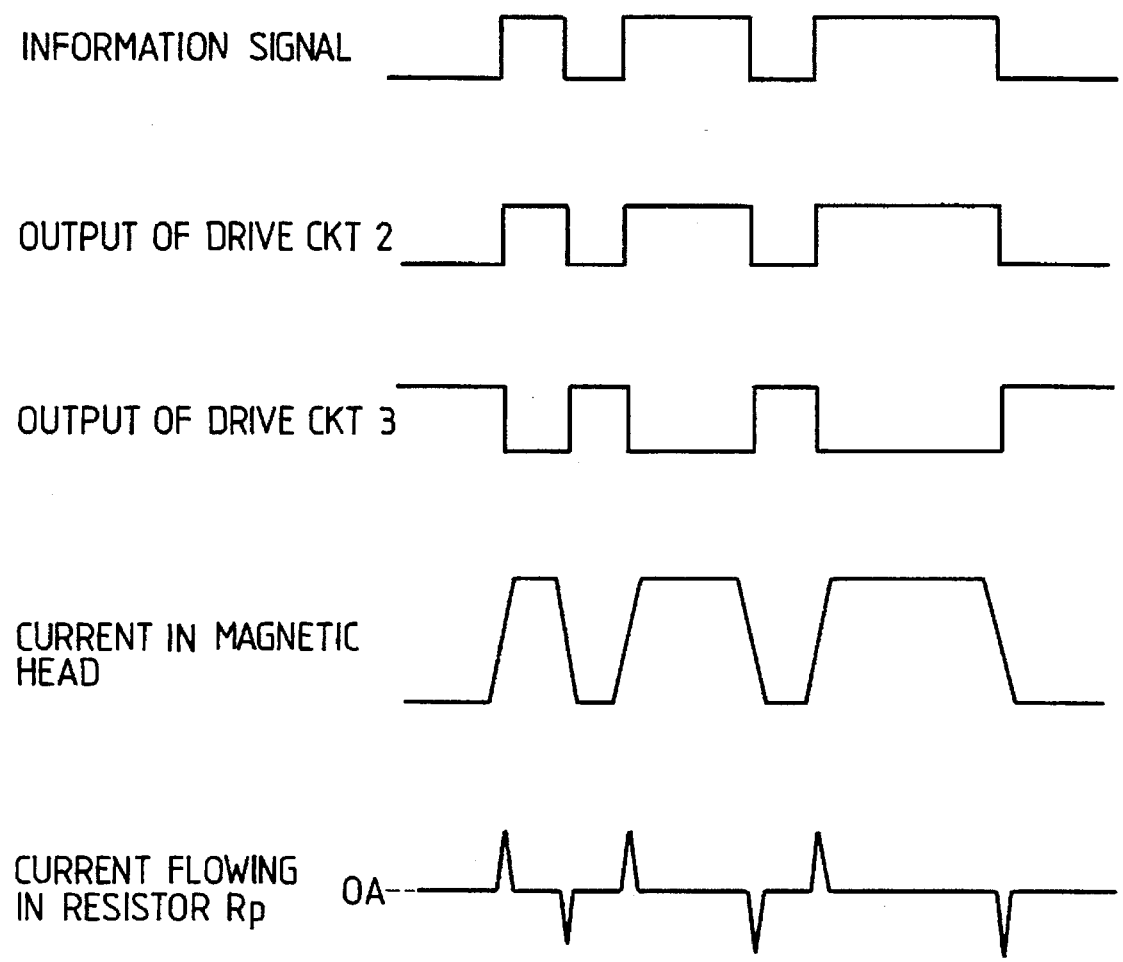
FIG. 5 is a wave form chart showing the current in a resistance, when the magnetic head in the conventional driving circuit is replaced by an equivalent circuit consisting of an inductance and the resistance.
Figure 6:
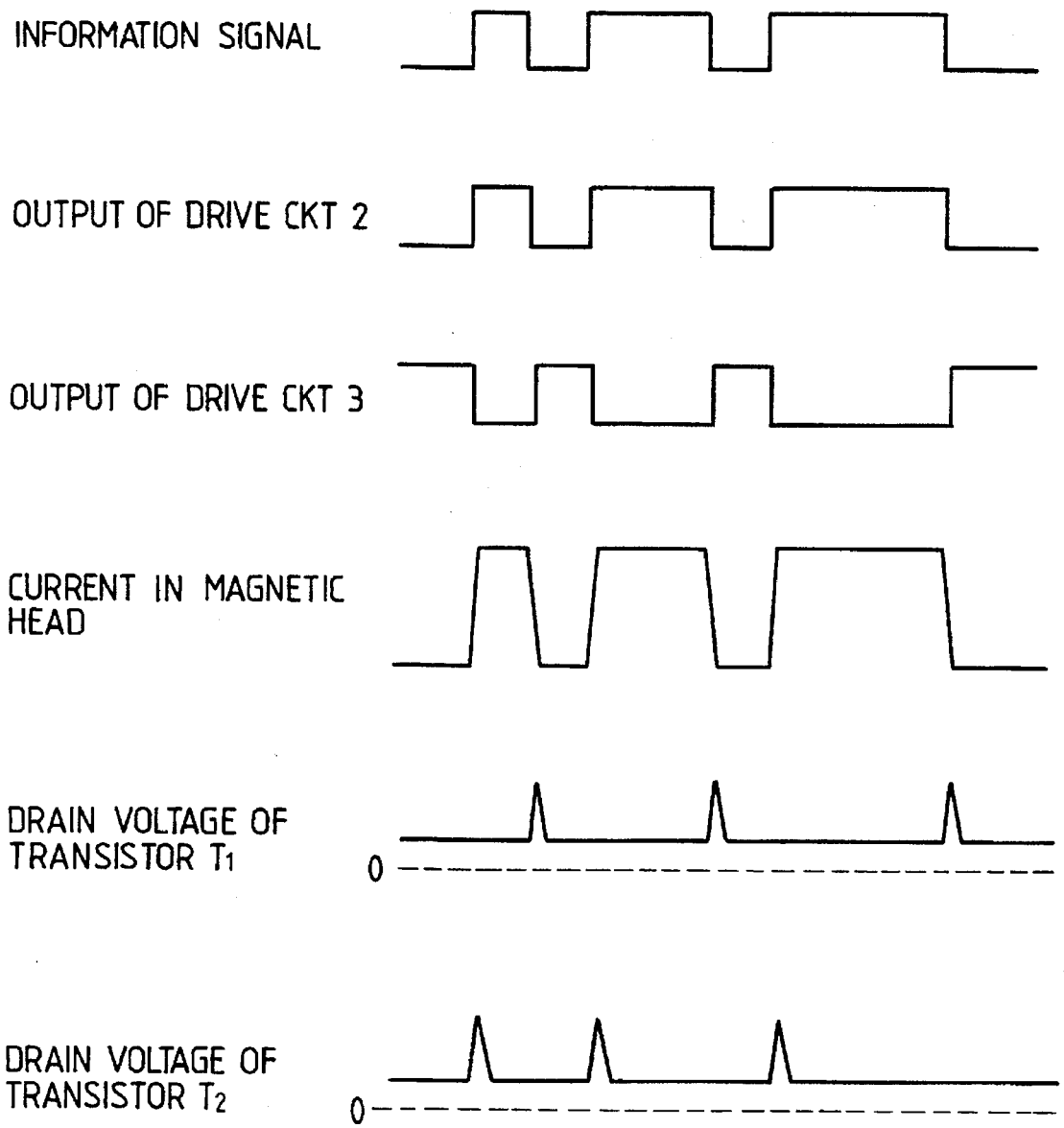
FIG. 6 is a timing chart showing signal wave forms at various points in the conventional driving circuit shown in FIG. 1.

FIG. 8 is a schematic view of a magnetooptical recording apparatus employing the magnetic head driving device of the present invention.

At first there will be explained the recording operation of this magnetooptical recording apparatus in the so-called optical modulation recording process in which an information signal is recorded by irradiating a magnetooptical disk, constituting a magnetooptical recording medium with a light beam modulated in intensity according to the information signal, while applying an external magnetic field to the thus irradiated portion of the magnetooptical disk. In the initial state prior to the recording, a magnetic film 100b of the magnetooptical disk 100 is assumed to have uniform downward magnetization. A laser light source 101 for emitting the light beam is on-off controlled by the information signal. For this purpose, there is provided a control circuit 102 for controlling the laser light source. The laser beam is condensed by an optical system 103 onto the magnetic film 100b. The temperature of an area (spot) irradiated by the laser beam rises so that the direction of magnetization thereof is easy to be inverted when the temperature thereof exceeds the Curie point. The magnetic head 1 is given a constant DC current by the control circuit 7, thereby generating a constant magnetic field B the direction of which is upward with respect to the disk face. Thus, the direction of magnetization of the magnetic film 100b only in the portion irradiated by the laser beam is inverted to assume magnetization upwardly, and the thus inverted magnetization is maintained because the temperature thereof goes down after the laser beam spot moves away therefrom. Thus, by the on-off control of the laser beam, the information signal is recorded in the magnetic film 100b, in the form of a pattern of magnetized areas of a size comparable to that of the laser beam spot (about 1 µm). In FIG. 8, there are also shown a protective film 100a for protecting the magnetic film 100b, and a glass or plastic substrate 100c.

The information signal, recorded by the changes in the direction of magnetization in the magnetic film 100b, can be reproduced by applying a laser beam having a constant intensity and detecting the rotation of the polarizing plane of the reflected laser beam, resulting from an optical-magnetic interaction, called a magnetic Kerr effect.

The magnetic Kerr effect is a phenomenon, when a linearly polarized laser beam is applied to a vertically magnetized film, that the polarizing plane of the reflected light rotates to the right or to the left, according to the direction of magnetization. The rotation is converted by an analyzer into a change in the amount of light, thereby reproducing the information signal.

In this process, in a case of rewriting the recorded information signal, there is at first conducted a so-called erasing operation, in which an inverse (downward) magnetic field is generated by the magnetic head 1 and the laser beam is continuously applied without modulation thereby aligning the magnetization of the magnetic film 100b uniformly downward, and then the new information signal is recorded according to the above-explained manner.

Operations in the magnetic field modulation recording process will be explained hereafter. The laser light source 101 is activated by a DC current supplied by the control circuit 102 to continuously emit the laser beam, which is converged by the optical system 103 onto the magnetic film 100b. The temperature of the area (spot) irradiated by the laser beam goes up, and the inversion of magnetization is facilitated when exceeding the Curie temperature. The magnetic head 1 receives a current from the magnetic head controlling circuit 7, and the direction of the generated magnetic field is inverted according to an information signal. In the information signal recording at a high speed, the magnetic head has to be made compact and to be positioned sufficiently close to the disk. Consequently, in the magnetic field modulation recording, different from the above-explained optical modulation recording, the magnetic head is preferably provided on a floating slider.

In the magnetic film 100b, the temperature rises only in the area irradiated by the laser beam, thereby forming a magnetization having the same direction as that of the magnetic field generated by the magnetic head 108. The magnetization thereof is maintained since the temperature thereof goes down as the laser spot moves away therefrom, caused by the rotation of the disk 100. Thus the information signal is recorded by such inversion of the magnetic field, in the magnetic film 100b, which causes formation of a pattern of magnetized areas of a size comparable to that of the laser beam spot (about 1 µm). This process does not require, at the rewriting of the information signal, the above-explained erasing operation in which the direction of magnetization is once aligned, but overwriting can be directly made any number of times by repeating the above-explained operation. Also, the recorded information signal can be reproduced in the same manner as in the aforementioned optical modulation process.

In the following there will be explained the function of the embodiment shown in FIG. 7, with reference to the timing charts shown in FIGS. 9(a) through 9(o). FIG. 9(a) indicates an operation enabling signal, supplied from an unrepresented main control unit to the control circuit 7, and enabling or disabling the function of the magnetic head 1 respectively in the high and low level state. A mode control signal in FIG. 9(b) instructs the magnetic field modulation recording mode or the optical modulation recording mode, respectively, in the low or high level state. A recording/erasure control signal in FIG. 9(c) instructs the erasing operation or the recording operation, respectively in the low or high level state, in the optical modulation recording mode. The information signal to be recorded on the magnetooptical recording medium is indicated in FIG. 9(d).

Now let us consider a situation in which the control circuit 7 receives a high-level operation enabling signal in FIG. 9(a) enabling the function of the magnetic head 1 and a low-level mode control signal in FIG. 9(b) instructing the magnetic modulation recording mode. Simultaneously with the instruction of these operations, the transfer of the information signal in FIG. 9(d) is started. Since the magnetic field modulation mode is selected, the recording/erasure control signal in FIG. 9(c) is in the low level state. In response to these instructions, the control circuit 7 supplies the driving circuits 2, 3 with drive signals S1, S2 corresponding to the magnetic field modulation as shown in FIGS. 9(f) and 9(g). More specifically the driving circuit 2 is given a drive signal S1 the same phase as the information signal, while the driving circuit 3 is given a driving signal S2 inverted in phase from the information signal. The driving circuits 5, 6 are given high-level signals as indicated in FIGS. 9(h) and 9(i). The driving circuits 2, 3, 5, 6 respectively generate driving voltages the same in phase as the received drive signals, for supply to the gates of the respectively corresponding transistors T1–T4. Thus the transistors T3, T4 are continuously turned on, while the transistors T1 and T2 are alternately turned on as in the conventional process. FIGS. 9(l) and 9(m) indicate the currents in the transistors T3, T4, while 9(j) and 9(k) indicate the currents in the transistors T1, T2. As a result, a direction of the current in the magnetic head 1 is switched, corresponding to the information signal, as shown in in FIG. 9(n), whereby a magnetic field ±$H_B$ is generated modulated according to the information signal as indicated in FIG. 9(o). The generated magnetic field is applied to an unrepresented magnetooptical recording medium. At the same time the recording medium is irradiated by a light beam having a recording power, $P_W$, as indicated in FIG. 9(e), by the optical head, and a series of information is recorded by the light beam irradiation and the application of the modulated magnetic field. In this manner the magnetization of the magnetic layer of the magnetooptical recording medium becomes oriented corresponding to the information signal, and there is achieved a so-called overwriting in the magnetic field modulation process in which the erasure of the old information and the recording of the new information are executed at the same time.

Then, let us assume that the mode control signal is shifted to the high level state, as shown in FIG. 9(b), for instructing the optical modulation mode. Since the erasing operation is required in this mode prior to the recording, the control circuit 7 is given a low-level recording/erasure control signal, instructing the erasing operation, as shown in FIG. 9(c). The erasing operation is conducted in order to erase the information already recorded in the magnetooptical recording medium, or to bring a recording area of which magnetization state is unclear to the erased state. When the optical modulation mode and the erasing operation are instructed, the control circuit 7 supplies the driving circuits 3, 5 with high-level drive signals S2, S3 as indicated in FIGS. 9(g) and 9(h), and also supplies the driving circuits 2, 6 with low-level drive signals S1, S4 indicated in FIGS. 9(f) and 9(i), whereby the transistors T2, T3 are turned on while the transistors T1, T4 are turned off, thus supplying the magnetic head 1 with a current $-I_{LC}$ of a fixed direction as indicated in FIG. 9(n). FIGS. 9(k) and 9(l) indicate the currents in the transistors T2, T3 while FIGS. 9(j) and 9(m) indicate the currents in the transistors T1, T4. Since the transistors T1, T4 are turned off in this state, the magnetic head 1 is given a current through the transistor T3, the auxiliary coil L1 and the transistor T2. As the transistor T4 is turned off, the magnetic head 1 is given a proper erasing current as shown in FIG. 9(n), without the reduction, in the conventional configuration, of the current in the magnetic head 1 caused by a current in the auxiliary coil L2 of the lower resistance. Consequently the magnetic head 1 generates an erasing bias magnetic field $-H_B$ as shown in FIG. 9(o), and applies the magnetic field to the magnetooptical recording medium, which is simultaneously irradiated with the light beam of an erasing power as indicated in FIG. 9(e), whereby the old information is erased by the light beam irradiation and the application of the magnetic field $-H_B$.

When the erasure of information is completed, the recording/erasure control signal is shifted to the high level state to instruct the information recording according to the optical modulation process. Simultaneously with the instruction, the transfer of the information signal is commenced. In response, the control circuit 7 supplies the driving circuits 3, 5 with low-level drive signals S2, S3 in FIGS. 9(g) and 9(h) and the driving circuits 2, 6 with high-level drive signals S1, S4 in FIGS. 9(f) and 9(i), whereby the transistors T2, T3 are turned off while the transistors T1, T4 are turned on thereby supplying the magnetic head 1 with a current $+I_{LC}$ of a direction opposite to the current direction in the erasing operation, as shown in FIG. 9(n). Since the transistor T3 is off in this state, the magnetic head 1 is given a proper current, without decrease by a current from the auxiliary coil L1 as in the conventional configuration. Consequently, the magnetic head 1 generates a recording bias magnetic field $+H_B$ as shown in FIG. 9(o), and applies the magnetic field to the recording medium, which is at the same time irradiated with a light beam modulated in intensity to a recording power $P_W$ and a reproducing power $P_r$ according to the information signal, as shown in FIG. 9(e). The information recording in the so-called optical modulation process is achieved by the light beam irradiation and the application of the bias magnetic field.

As explained in the foregoing, the present embodiment can resolve the drawback in the conventional configuration of the current decrease in the magnetic head at the erasing and recording operations, by serially connecting the transistors T3, T4 respectively with the auxiliary coils L1, L2 and controlling the transistors T3, T4 according to the erasing and recording operations in the optical modulation process, thereby intercepting the current from the auxiliary coil of a smaller resistance. Consequently, the bias magnetic field for erasing or recording from the magnetic head becomes no longer deficient, and the erasing and recording operations in the optical operation process, which have been difficult to achieve in the conventional magnetic head driving circuit for the magnetic field modulation process, can be effectively achieved. Also, in the magnetic field modulation mode, the magnetic head can be driven in that mode in the conventional manner, by turning on the transistors T3 and T4. Consequently, a driving circuit can drive the magnetic head in each of the magnetic field modulation process and the optical modulation process, and the information recording can be achieved in either of those processes on a magnetooptical recording medium of the first generation or on that of the recent second generation.

The foregoing embodiment employs the field effect transistors T3, T4 for current control for the auxiliary coils L1, L2, but the transistors need not be high-speed switching elements because they are only required to function at the switching of the operating mode or at the switching of the recording and erasing operations. For this purpose there may be employed low-speed field effect transistors, bipolar transistors or mechanical switches such as lead switches. Also, for minimizing the power loss in the transistors T3, T4, there are preferred those of a low on-resistance. On the other hand, the transistors T1, T2 have to effect high-speed switching, corresponding to the high frequency information signal, they need to have frequency characteristics corresponding to the recording frequency. Also, the foregoing embodiment employs a continuous recording laser beam in the magnetic field modulation recording mode, but the overwriting operation also can be achieved also by a pulse laser beam.

Another embodiment of the magnetic head driving device of the present invention can also be employed in the magnetooptical recording apparatus shown in FIG. 8, in a similar manner as the foregoing first embodiment. In the following description there will be explained the operation in the magnetic field modulation recording mode.

Figure 10:
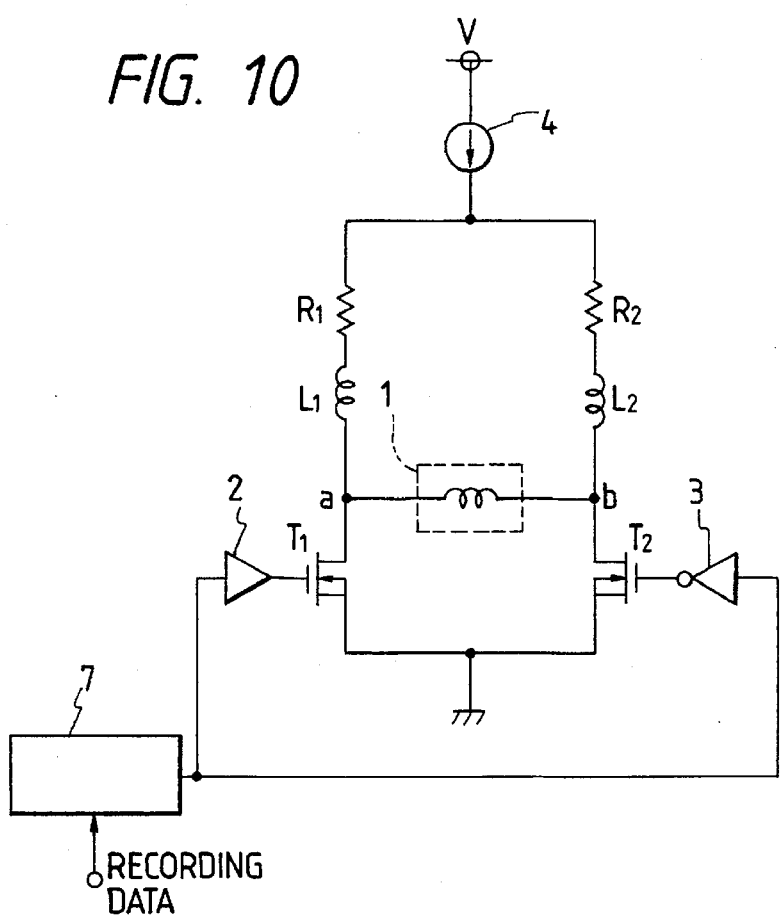
FIG. 10 is a circuit diagram of a second embodiment of the present invention.

FIG. 10 is a circuit diagram of a second embodiment of the magnetic head driving device of the present invention, wherein components equivalent in function to those in the conventional device shown in FIG. 1 are represented by the same symbols, and will not be explained further. Referring to FIG. 10, resistors R1, R2 are respectively connected serially to the auxiliary coils L1, L2 for alleviating the loads of the transistors T1, T2 as will be explained in detail later. The transistors T1, T2 in this embodiment are composed of power MOS FET's. There are also shown a magnetic head 1 for generating a modulated magnetic field; a constant current source 4 for maintaining a constant current in the magnetic head 1; and recording circuits 2, 3 for applying drive voltages to the gates of the transistors T1, T2 according to the recording data (information signal). In this embodiment the driving circuit 2 is composed of a buffer gate for applying the recording data in the same phase to the gate of the transistor T1, while the driving circuit 3 is composed of an inverter gate for applying the recording data with phase inversion to the gate of the transistor T2.

FIGS. 11(a) through 11(h) show the signal wave forms in various parts of the above-explained embodiment, wherein FIG. 11(a) shows the recording data, FIG. 11(b) indicates the gate voltage of the transistor T1, and FIG. 11(c) indicates the gate voltage of the transistor T2. With the application of the driving voltages, which are respectively the same as and inverted from the recording data in phase, to the gates, the transistors T1, T2 are alternately turned on, whereby the magnetic head 1 is given an AC current shown in in FIG. 11(d) and generates a magnetic field modulated according to the information signal. Also FIGS. 11(e) and 11(g) respectively show currents of the transistors T1 and T2, and FIGS. 11(f) and 11(h) respectively show the potentials of points a and b in FIG. 10. The potentials are based on the assumption that the current source 4 does not have a voltage drop therein. The potentials of the points a, b are given by the power source voltage V minus the voltage drops caused by the DC resistances $R_L$ of the auxiliary coils L1, L2 and of the resistors R1, R2. Thus, the potentials $V_1$ of the points a, b are given by $V_1 = V - (R_L + R)I_{LC}$ wherein $\pm I_{LC}$ is the current in the magnetic head 1, and R is the resistance of the resistors R1, R2. Consequently, the transistors T1, T2 are given a voltage $V_1$, and there is generated a current $2I_{LC}$ when the transistor T1 or T2 is turned on. Thus, if the recording data do not contain the DC component, the average power consumed in the transistor T1 or T2 is given by $V_1 \cdot 2I_{LC}/2 = V_1 \cdot I_{LC}$.

As an example, the potential $V_1$ of the points a, b becomes 1.25 V for a DC resistance $R_L$ of the auxiliary coils of 0.5Ω, a DC power source voltage V of 5 V, a current $I_{LC}$ of the magnetic head of 300 mA and a resistance R of the resistors R1, R2 of 12Ω. Thus, if the recording data are free of the DC component, the average power consumption in the transistor T1 or T2 is 0.375 W (1.25 V×0.3 A). Consequently, if the transistors T1, T2 are composed of power MOS FET's capable of high-speed switching with a current upshift time and a current downshift time of several nanoseconds, the above-mentioned average power consumption is sufficiently within the absolute nominal power rating which is generally about 1 W. Also, even if one of the transistors is continuously turned on while the other is continuously turned off, the power consumption in such case becomes 0.75 W (1.25 V×2×0.3 A), which is still sufficiently within the nominal power rating. Consequently, even if the recording data are not free from the DC component, the power consumptions in the transistors T1, T2 are both within the nominal power rating, so that they are not destructed and can be used without heat dissipation. In the foregoing description it is assumed that the current source is free from a voltage drop, but, in practice, the current source shows a certain voltage drop and bears a part of the power consumption, so that the load on the transistors is further alleviated. Besides, the presence of the resistors R1, R2 also alleviates the load on the current source.

Figure 12:
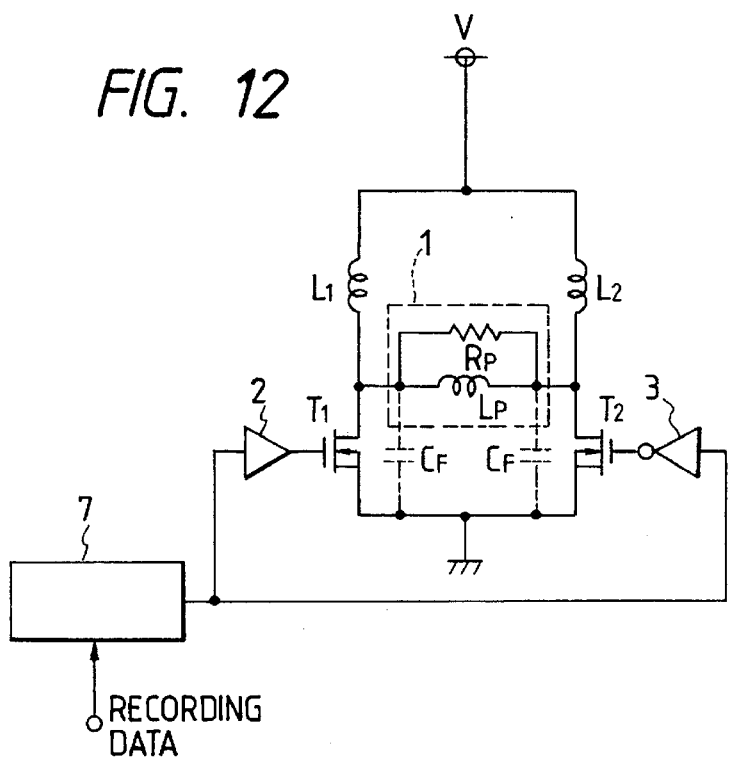
FIG. 12 is a circuit diagram of a third embodiment of the present invention.

FIG. 12 is a circuit diagram of a third embodiment of the magnetic head driving device of the present invention, wherein the same components as those in FIG. 10 are represented by the same symbols. In this embodiment, the magnetic head 1 is represented by an equivalent circuit consisting of a parallel connection of an inductance $L_p$ and a resistance $R_p$, respectively selected as 1 μH and 500Ω. In FIG. 12, the floating capacitances at both ends of the magnetic head 1 are represented by $C_F$, which is assumed to be 30 pF. The floating capacitances are principally composed of the drain-source capacitances of the transistors T1, T2, the capacitances of the patterns on the printed circuit board, those between the wound lines of the auxiliary coils L1, 12 etc. Other configurations are the same as those in FIG. 10, except for the absence of the resistors R1, R2. Consequently, the magnetic head 1 generates a magnetic field modulated according to the information signal, by the control of the switching operations of the transistors T1, T2. FIGS. 13(a) through 13(c) are charts showing signals in various parts of the present embodiment, wherein FIG. 13(a) indicates the recording data, FIGS. 13(b) and 13(c) respectively show the gate voltages of the transistors T1, T2, and FIG. 13(d) indicates the current in the magnetic head 1. The inversion of the current is made rapidly by a suitable parameter setting in the circuit, as will be explained later. Also, FIG. 13(e) indicates the current in the resistance $R_p$.

The magnetic field inversion time $t_{sw}$ of the magnetic head 1 is approximately determined by the inductance $L_p$ thereof and the floating capacitances $C_F$ of the circuits connected to the both ends of magnetic head 1. The inversion time $t_{sw}$, if defined as a time required to cross 10 to 90% of the magnetic field amplitude, is given by:

$$t_{sw} \cong [\sin^{-1}(0.8) - \sin^{-1}(-0.8)] \times \sqrt{L_p \cdot C_F}$$

In this embodiment where $L_p=1$ μH and $C_F=30$ pF, the above-mentioned equation provides $t_{sw} \cong 10$ ns, thus realizing a sufficiently fast magnetic field inversion.

Also, in order to obtain a magnetic field inversion time of 20 ns or shorter with a magnetic head of an inductance as large as 2.0 μH, the floating capacitance has to be 58 pF or lower. FIG. 13(d) shows the current of the magnetic head 1, of which the inversion time is thus shortened. A broken-lined wave form indicates the current in the conventional magnetic head.

The reduction in the floating capacitances can be achieved, for example, by separating the circuit patterns connected to both ends of the magnetic head 1 by at least 1 mm from other circuit patterns, and selecting elements such as switching elements or auxiliary coils of smaller floating capacitances, to be connected to the circuit patterns.

For example, it is also important to reduce the capacitance between the winding lines of the auxiliary coils L1, L2. However, as already known, the inductances of the auxiliary coils L1, L2 have to be sufficiently larger, by at least 10 times, than that of the magnetic head 1. In general the inductance becomes larger with an increase in the number of turns of a coil, but the capacitance between the winding lines increases at the same time. Consequently, it is not preferable to unnecessarily increase the number of turns of the auxiliary coils in order to increase the inductances thereof, and the inductances of the auxiliary coils L1, L2 is preferably within a range of 10 to 100 times that of the magnetic head 1. Also, the capacitance between the winding lines has to be sufficiently small in order to reduce the magnetic field inversion time of the magnetic head as explained before, but, according to the experiments of the present inventors, it is particularly effective that the self resonance frequency of the auxiliary coils L1, L2, represented by $f_0 = 1/(2\pi\sqrt{L_A \cdot C_A})$, is to be higher than the maximum frequency of the information signal to be recorded, wherein $L_A$ is the inductance of the auxiliary coils L1, L2 and $C_A$ is the capacitance between the winding lines of the coils.

For example, if the inductance $L_A$ of the auxiliary coils is 50 μH, the capacitance has to satisfy a condition $C_A < 20$ pF for a maximum frequency of 5 MHz of the information signal to be recorded, or $C_A < 5$ pF for a maximum frequency of 10 MHz.

Figure 14:
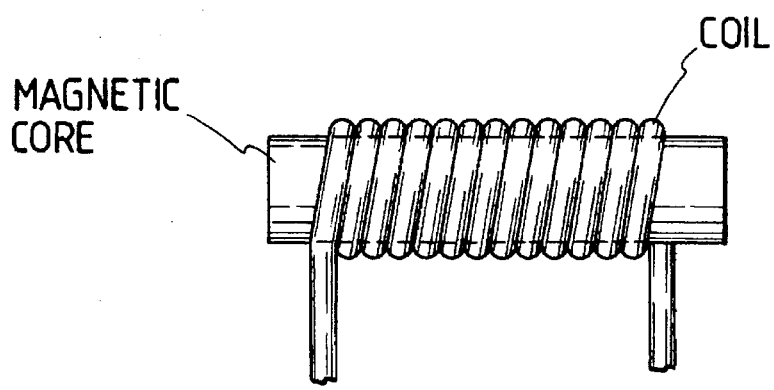
FIGS. 14, 15 and 16 are views showing winding methods of the auxiliary coil in the present invention.
Figure 15:
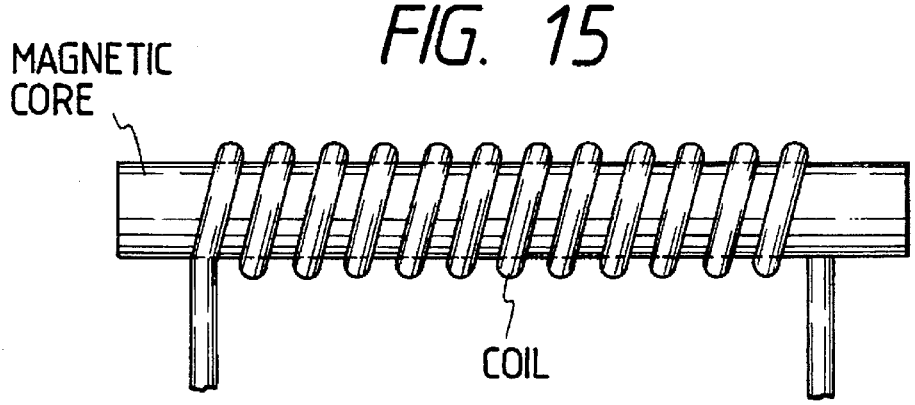
Figure 16:
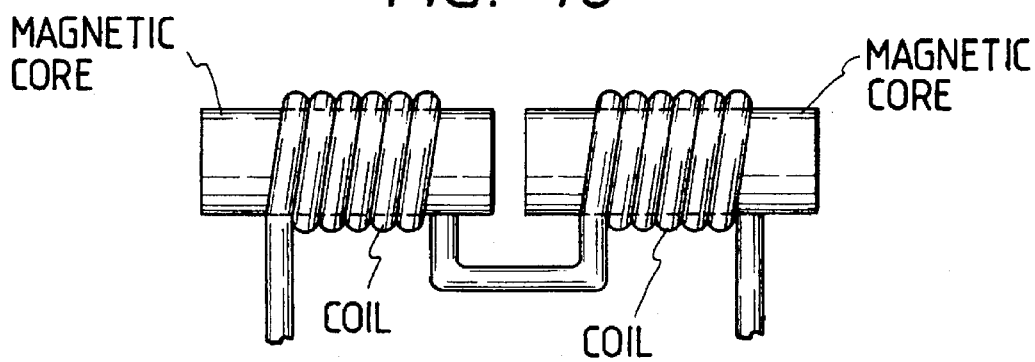

In the following there will be explained methods for reducing the capacitance between the winding lines. FIGS. 14 to 16 illustrate methods of coil winding with reduced capacitance between the winding lines. As shown in FIG. 14, a single-layered winding on the core reduces the capacitance, in comparison with a multi-layered winding. Also, a spaced winding as shown in FIG. 15 reduces the capacitance in comparison with the tight winding. Furthermore, a serial connection of plural coils with a limited number of turns as shown in FIG. 16 reduces the total capacitance between the winding lines.

Also, a reduction in the inversion time of the modulated magnetic field as explained before increases the maximum frequency used in the recording, thereby increasing the loss in the magnetic head 1. More specifically, when the magnetic head 1 and the driving circuits explained above are used for modulation with a repeating frequency of 6.0 MHz, the loss in the magnetic head amounts to 0.2 W. Based on this fact, the loss in the magnetic head 1 can be made 0.2 W or less if $R_p$ is at least about 500Ω. Also, $R_p$ can be made larger, for example, by reducing the size of the core of the magnetic head and winding the coil thereon without spacing of the winding lines.

Based on these facts, the magnetic field inversion time of the magnetic head 1 can be effectively shortened by selecting the inductance $L_p$ of the magnetic head 1 as 0.2–2 μH in the vicinity of the maximum frequency of the information recording frequency range, also the resistance $R_p$ of the head to be about 200Ω, and the floating capacitance $C_F$ between the ends of the magnetic head 1 and the ground and the above-mentioned inductance $L_p$ so as to satisfy a relation $L_p \cdot C_F < 200$ μH·pF.

A relation $L_p \cdot C_F < 100$ μH·pF is more preferable in order to bring the magnetic field inversion time to 20 ns or less.

Also, since the loss of the magnetic head 1 does not increase even when the magnetic field inversion time is shortened, it is rendered possible to simultaneously realize the high-speed inversion of the magnetic field and the reduction of loss, which have been mutually antagonizing factors in the conventional configuration, and the performance of the magnetic head can be significantly improved.

Figure 17:
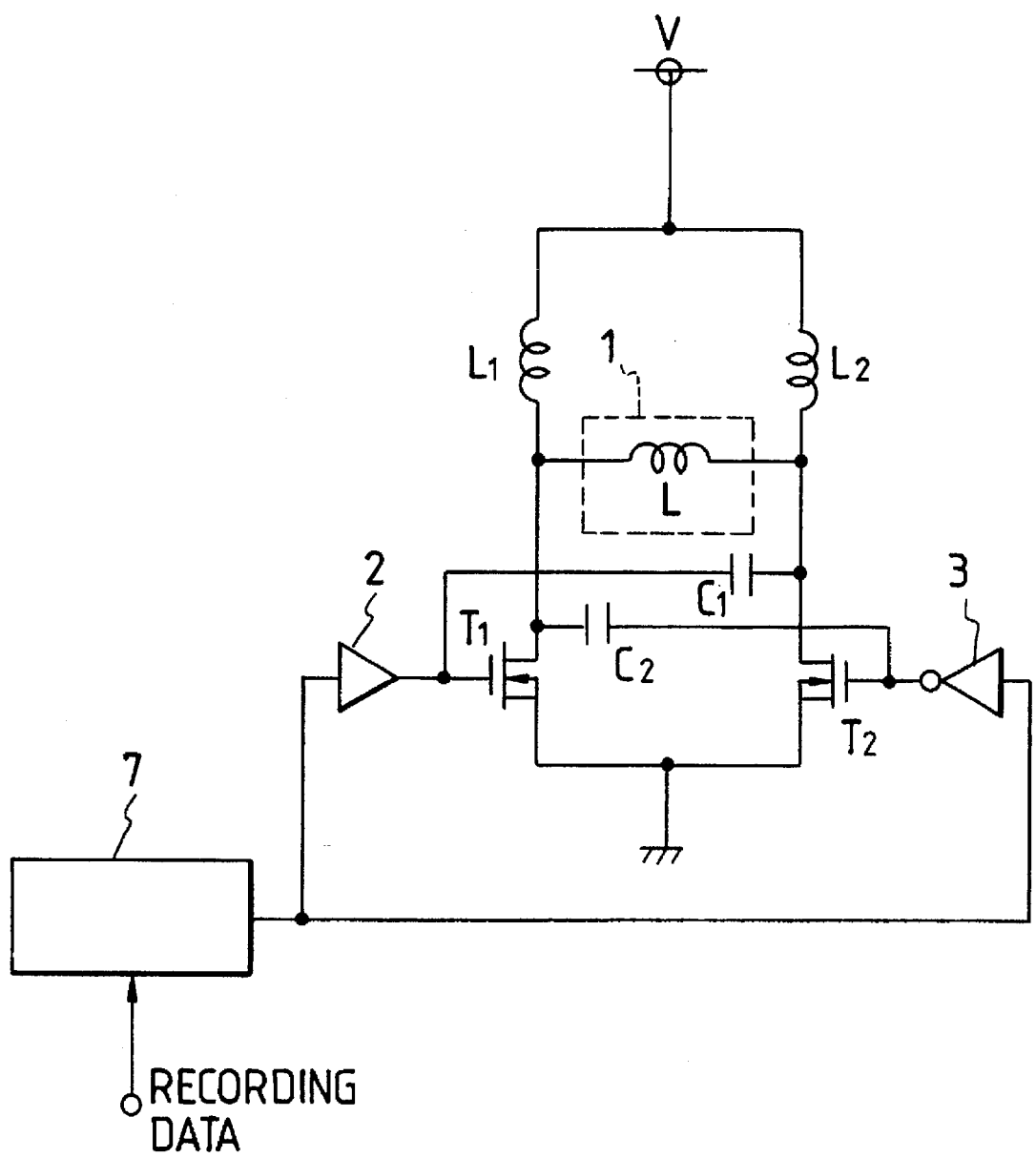
FIG. 17 is a circuit diagram of a fourth embodiment of the present invention.

FIG. 17 is a circuit diagram of a fourth embodiment of the magnetic head driving device of the present invention, wherein provided are a capacitor C1 connected between the gate of the transistor T1 and the drain of the transistor T2, and a capacitor C2 connected between the gate of the transistor T2 and the drain of the transistor T1. As will be explained later in more detail, the capacitors C1, C2 serve to apply instantaneously high voltages to the gates of the transistors T1, T2 even when the power source voltage becomes lower, thereby preventing the decrease in the modulated current of the magnetic head 1. The other basis structures are the same as those in FIG. 12 and will not, therefore, be explained further. FIGS. 18(a) through 18(f) show signals in various parts of this embodiment, wherein FIG. 18(a) indicates the recording data, and FIGS. 18(b) and 18(c) respectively indicate the gate voltages of the transistors T1, T2. When the transistor T1 is turned off, an inverse voltage is generated by the auxiliary coil 11 and the magnetic head 1 at the drain of the transistor T1, and the high frequency components of the inverse voltage are applied, through the capacitor C2, to the gate of the transistor T2 which is to be turned on. In FIG. 18(c), the instantaneous high voltage at the upshift of the gate voltage is the inverse voltage component applied through the capacitor C2 in the above-explained manner. Also, when the transistor T2 is turned off, an inverse voltage is similarly generated by the auxiliary coil L2 and the magnetic head 1 as shown in FIG. 18(f), and components of the inverse voltage are applied, through the capacitor C1, to the gate of the transistor T1 to be turned on. Thus, an instantaneous high voltage is applied also in this case to the gate of the transistor T1 as shown in FIG. 18(b).

As high voltages are applied to the gates of the transistors T1, T2 when they are turned on, the currents in the transistors T1, T2 are not reduced even if the power source voltage is lowered, so that a proper current can be supplied to the magnetic head. Therefore, also in response to the recent trend toward a lower power source voltage, the magnetic head can be driven properly merely by the addition of the capacitors. However, if the capacitances of the capacitors C1, C2 are excessively large, the floating capacitances connected to the ends of the magnetic head increase, thereby extending the magnetic field inversion time. Consequently, the capacitances of the capacitors should be smaller than the floating capacitances when the capacitors are not connected, and are preferably sufficiently smaller than the floating capacitances between the ends of the magnetic head and the ground.

FIG. 19 is a circuit diagram of a fifth embodiment of the magnetic head driving device of the present invention, wherein provided are a diode D1 connected between the commonly connected sources of the transistors T1, T2 and the ground. The other basic structures are the same as those shown in FIGS. 12 and 17, and will not, therefore, be explained further. When this device is in operation, either of the transistors T1, T2 is always turned on, so that a current is always present in the diode D1. Consequently, the potential of the sources of the transistors T1, T2 is always higher than the ground level by the forward voltage of the diode D1. Thus, when the transistor T1 or T2 is turned off by a change of the gate voltage from the high level state to the low level state, there is generated an inverse voltage between the gate and the source, whereby the charge on the gate is dissipated more quickly and the turn-off time can be shortened. This embodiment can shorten the turn-off time of the transistors by attaching a diode to the parallel connected sources of the transistors, without the necessity of attaching diodes respectively to the transistors.

FIG. 20 is a circuit diagram of a sixth embodiment of the magnetic head driving device of the present invention, wherein diodes D2, D3 are respectively connected between the sources of the transistors T1, T2 and the ground. The other structures are the same as those shown in FIG. 19. During the operation of the device, the transistors T1, T2 are alternately turned on, and the diode connected to the source of the turned-on transistor is biased in the forward direction, so that the source potential of the transistor becomes higher by the forward voltage of the diode. For example, when the transistor T1 is turned on, the diode D2 is forward biased, whereby the source potential of the transistor T1 becomes higher by the forward voltage of the diode. Thus, when each transistor is turned off, the gate potential of the transistor becomes lower than the source potential and is inversely biased, so that the turn-off time of the transistors can be reduced as in the foregoing embodiment shown in FIG. 19.

Also, in this embodiment, since the diodes D2, D3 are respectively connected serially to the sources of the transistors T1, T2, there are obtained advantages not only of reducing the turn-off time of the transistors but also of preventing an inverse current between the drain and the source of each transistor. FIGS. 21(a) through 21(f) show the signal wave forms in various points in this embodiment, wherein FIGS. 21(e) and 21(f) respectively show the drain voltages of the transistors T1, T2. When the transistor T1 or T2 is turned off, an inverse voltage is generated in the auxiliary coil connected to the drain of the transistor, and is applied to the drain. The inverse voltage may become lower than 0 V as shown in FIGS. 21(e) and 21(f), whereby an inverse current may be generated from the source to the drain of each transistor. In the present embodiment, however, the diode connected to the source of each transistor prevents such inverse current, thereby avoiding distortion of the current in the magnetic head. FIG. 21(a) indicates the recording data, FIG. 21(b) and 21(c) indicate the gate voltages of the transistors T1, T2, and FIG. 21(d) shows the current in the magnetic head.

As explained in the foregoing, the present invention provides the following advantages:

(1) A single magnetic head driving device can provide a magnetic field suitable for the magnetic field modulation process or for the optical modulation process, avoiding the deficiency of a magnetic field conventionally encountered in the optical modulation process;

(2) Resistors respectively connected serially to the switching elements can alleviate the power loads on the switching elements, thus avoiding the danger of destruction thereof;

(3) The magnetic field inversion time can be shortened without an increase in the loss of the magnetic head, by selecting the equivalent inductance of the magnetic head to be 0.2–2.0 µH and the equivalent resistance to be 200Ω or larger in the vicinity of the maximum frequency of the recording frequency range;

(4) The control terminal of the switching element to be turned on can be given a high voltage, by the application of the inverse voltage generated in the auxiliary coil through the capacitance element so that the magnetic head can be driven in a proper manner even when the power source voltage is reduced;

(5) The turn-off time of the switching elements can be shortened and the magnetic field inversion time can therefore be shortened, by mutually connecting the terminals at the ground side of the switching elements and connecting a diode between the point of the connection and the ground;

(6) Diodes respectively connected to the terminals of the switching elements at the ground side allow not only to shortening of the magnetic field inversion time but also the inverse currents in the switching current, resulting from the inverse voltage generated in the auxiliary coils, thereby preventing distortion in the modulated magnetic field; and (7) The magnetic field inversion time can be shortened by a condition $L_p \cdot C_F < 200$ µH·pF wherein $L_p$ is the inductance of the magnetic head and $C_F$ is the capacitance between the end of the magnetic head and the ground.

What is claimed is:

1. A magnetooptical recording apparatus comprising:
   a light source for irradiating a magnetooptical recording medium with a light beam;
   a light source control circuit for controlling said light source;
   a magnetic head for applying a magnetic field to the magnetooptical recording medium; and
   a magnetic head drive device for supplying current to said magnetic head, said magnetic head drive device comprising:
      a first auxiliary coil;
      a second auxiliary coil;
      a first switching element serially connected to said first auxiliary coil;
      a second switching element serially connected to said second auxiliary coil;
      a magnetic head connected between the junction between said first auxiliary coil and said first switching element and the junction between said second auxiliary coil and said second switching element;
      a power source connected between said first auxiliary coil and said second auxiliary coil;
      a third switching element serially connected to said first auxiliary coil between said power source and said first switching element; and
      a fourth switching element serially connected to said second auxiliary coil between said power source and said second switching element,
   wherein said magnetooptical recording apparatus performs a first operation and at least one of second and third operations in which,
      (i) in the first operation, said third and fourth switching elements are each rendered to ON states while said first and second switching elements are alternately rendered to an ON state and an OFF state, in accordance with an information signal so that said magnetic head drive device supplies current to said magnetic head to generate a magnetic field modulated according to the information signal simultaneously with said light source control circuit controlling said light source to generate the light beam,
      (ii) in the second operation, said first and fourth switching elements are each rendered to OFF states while said second and third switching elements are respectively rendered to ON states so that said magnetic head drive device supplies current to said magnetic head to generate a magnetic field simultaneously with said light source control circuit controlling said light source to generate the light beam, and
      (iii) in the third operation, said first and fourth switching elements in said magnetic head drive device are each rendered to ON states while said second and third switching elements are each rendered to OFF states so that said magnetic head drive device supplies current to said magnetic head to generate a magnetic field simultaneously with said light source control circuit controlling said light source, to generate a light beam modulated according to the information signal.

2. A magnetooptical recording apparatus comprising:
   means for irradiating a light beam to a magnetooptical recording medium;
   a magnetic head for applying a magnetic field to the magnetooptical recording medium; and
   a magnetic head drive device for supplying current modulated according to an information signal to said magnetic head,
   wherein, in said magnetic head drive device, when said magnetic head is regarded as being equivalent to a parallel circuit having an inductance Lp and a resistance Rp, the inductance Lp is in a range of 0.2 to 2.0 µH and the resistance Rp is at least 200Ω in the maximum frequency of the information signal.

3. A magnetooptical recording apparatus comprising:
   means for irradiating a light beam to a magnetooptical recording medium;
   a magnetic head for applying a magnetic field to the magnetooptical recording medium; and
   a magnetic head drive device for supplying current modulated according to an information signal to said magnetic head,
   wherein when an inductance of said magnetic head is Lp, a floating capacitance between an end portion of said magnetic head and ground is $C_F$, the following relation is satisfied, $$Lp \cdot C_F \leq 200 \text{ µH·pF}.$$

4. A magnetic head drive device comprising:
   a first auxiliary coil;
   a second auxiliary coil;
   a first transistor element serially connected to said first auxiliary coil;
   a second transistor element serially connected to said second auxiliary coil;

a magnetic head connected between the junction between said first auxiliary coil and said first transistor element and the junction between said second auxiliary coil and said second transistor element;

a power source connected between said first auxiliary coil and said second auxiliary coil;

control means for alternately effecting ON/OFF operation for said first and second transistor elements in accordance with an information signal;

a first condenser element connected between the junction between said second auxiliary coil and said second transistor element and a control terminal of said first transistor element; and a second condenser element connected between the junction between said first auxiliary coil and said first transistor element and a control terminal of said second transistor element.

5. A magnetic head drive device according to claim 4, wherein said magnetic head drive device is used in a magnetooptical recording apparatus.

6. A magnetic head drive device comprising:

a first auxiliary coil;

a second auxiliary coil;

a first transistor element serially connected to said first auxiliary coil;

a second transistor element serially connected to said second auxiliary coil;

a magnetic head connected between the junction between said first auxiliary coil and said first transistor element and the junction between said second auxiliary coil and said second transistor element;

a power source connected between said first auxiliary coil and said second auxiliary coil;

control means for alternately effecting ON/OFF operation for said first transistor element and said second transistor element in accordance with an information signal;

a first diode element serially connected to said first transistor element for preventing a reverse flow of current; and a second diode element serially connected to said second transistor element for preventing a reverse flow of current.

7. A magnetic head drive device according to claim 6, wherein said magnetic head drive device is used in a magnetooptical recording apparatus.

8. A magnetic head drive device comprising:

a first auxiliary coil;

a second auxiliary coil;

a first transistor element serially connected to said first auxiliary coil;

a second transistor element serially connected to said second auxiliary coil;

a magnetic head connected between the junction between said first auxiliary coil and said first transistor element and the junction between said second auxiliary coil and said second transistor element;

a power source connected between said first auxiliary coil and said second auxiliary coil;

control means for alternately effecting ON/OFF operation for said first transistor element and said second transistor element in accordance with an information signal; and a diode element connected between the junction between said first and second transistor elements and ground.

9. A magnetic head drive device according to claim 8, wherein said magnetic head drive device is used in a magnetooptical recording apparatus.

10. A magnetic head drive device comprising:

a first auxiliary coil;

a second auxiliary coil;

a first switching element serially connected to said first auxiliary coil;

a second switching element serially connected to said second auxiliary coil;

a magnetic head connected between the junction between said first auxiliary coil and said first switching element and the junction between said second auxiliary coil and said second switching element;

a power source connected between said first auxiliary coil and said second auxiliary coil; and control means for alternately effecting ON/OFF operation for said first and second switching elements in accordance with an information signal, wherein the self resonance frequencies of said first and second auxiliary coils are higher than the maximum frequency of the information signal.

11. A magnetic head drive device according to claim 10, wherein said magnetic head drive device is used in a magnetooptical recording apparatus.

12. A magnetic head drive device according to claim 10, wherein said first and second auxiliary coils each comprise a single layered coil wound around a core.

13. A magnetic head drive device according to claim 10, wherein said first and second auxiliary coils each comprise a coil wound around a core with a predetermined spacing for a winding.

14. A magnetic head drive device according to claim 10, wherein said first and second auxiliary coils comprise a plurality of coils having a fewer number of turns being serially connected, respectively.

* * * * *

UNITED STATES PATENT AND TRADEMARK OFFICE
CERTIFICATE OF CORRECTION

PATENT NO. : 5,661,612
DATED : August 26, 1997
INVENTOR(S) : KOYO HASEGAWA, ET AL.

It is certified that error appears in the above-indentified patent and that said Letters Patent is hereby corrected as shown below:

IN THE DRAWINGS:

Figures 19 and 20 should be inserted as follows:

--

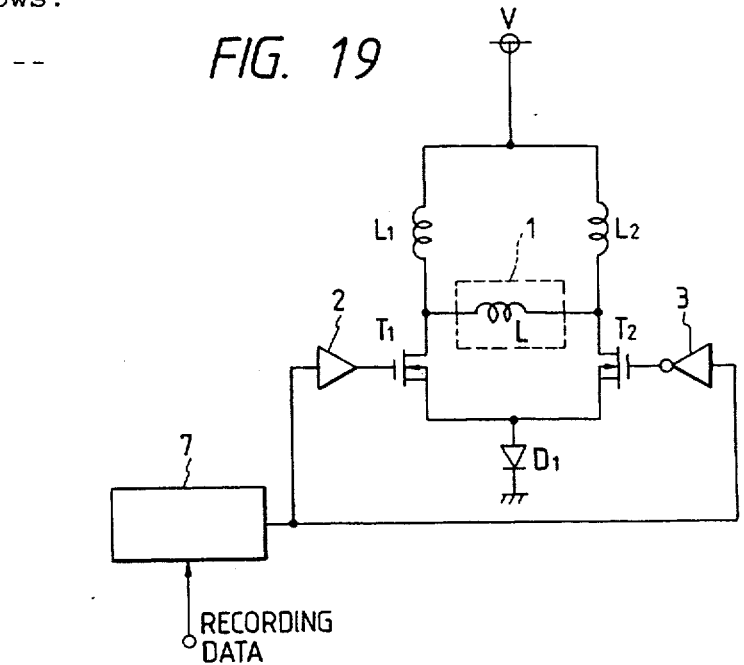

FIG. 19

UNITED STATES PATENT AND TRADEMARK OFFICE
CERTIFICATE OF CORRECTION

PATENT NO. : 5,661,612
DATED : August 26, 1997
INVENTOR(S) : KOYO HASEGAWA, ET AL.

It is certified that error appears in the above-identified patent and that said Letters Patent is hereby corrected as shown below:

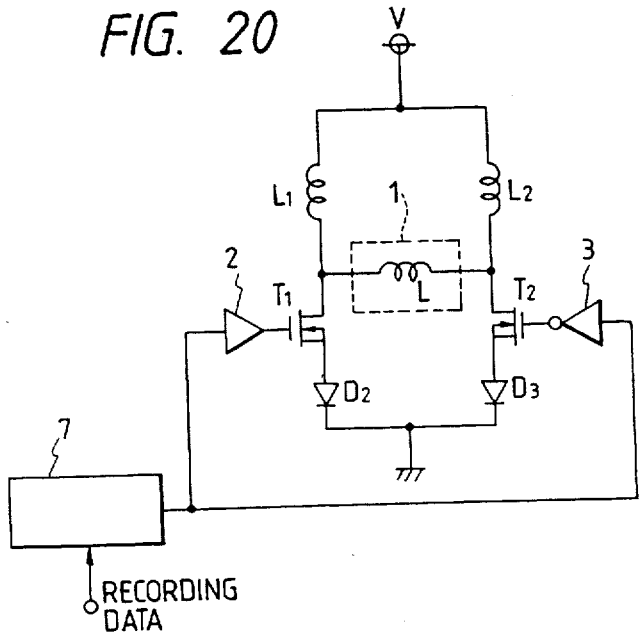

FIG. 20

UNITED STATES PATENT AND TRADEMARK OFFICE
CERTIFICATE OF CORRECTION

PATENT NO. : 5,661,612
DATED : August 26, 1997
INVENTOR(S) : KOYO HASEGAWA, ET AL.

It is certified that error appears in the above-indentified patent and that said Letters Patent is hereby corrected as shown below:

COLUMN 4:

Line 55, "ca." should read --about--.

COLUMN 7:

Line 23, "With" should read --with--.

COLUMN 13:

Line 53, "12" should read --L2,--.

COLUMN 17:

Line 27, delete "to".

Signed and Sealed this

Twenty-eighth Day of April, 1998

Attest:

BRUCE LEHMAN

Attesting Officer     Commissioner of Patents and Trademarks